US009911753B2

United States Patent
Kitamura et al.

(10) Patent No.: US 9,911,753 B2
(45) Date of Patent: Mar. 6, 2018

(54) SEMICONDUCTOR DEVICE AND METHOD FOR MANUFACTURING SEMICONDUCTOR DEVICE

(71) Applicant: Toshiba Memory Corporation, Tokyo (JP)

(72) Inventors: Masayuki Kitamura, Mie (JP); Atsuko Sakata, Mie (JP); Satoshi Wakatsuki, Mie (JP); Takeshi Ishizaki, Aichi (JP); Daisuke Ikeno, Mie (JP); Tomotaka Ariga, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/257,138

(22) Filed: Sep. 6, 2016

(65) Prior Publication Data

US 2017/0207236 A1 Jul. 20, 2017

Related U.S. Application Data

(60) Provisional application No. 62/279,239, filed on Jan. 15, 2016.

(51) Int. Cl.
*H01L 27/115* (2017.01)
*H01L 21/48* (2006.01)
*H01L 23/498* (2006.01)
*H01L 29/792* (2006.01)
*H01L 29/66* (2006.01)
*H01L 27/11582* (2017.01)
*H01L 27/11556* (2017.01)

(52) U.S. Cl.
CPC ...... *H01L 27/11582* (2013.01); *H01L 21/486* (2013.01); *H01L 23/49827* (2013.01); *H01L 27/11556* (2013.01); *H01L 29/66833* (2013.01); *H01L 29/7926* (2013.01)

(58) Field of Classification Search
CPC ............ H01L 21/486; H01L 21/76264; H01L 21/7682; H01L 21/8221; H01L 23/4821; H01L 23/49827; H01L 27/11582; H01L 27/11556; H01L 27/15533; H01L 27/11521; H01L 27/11514; H01L 27/0688; H01L 29/0689; H01L 29/66833; H01L 29/7926; H01L 2221/1042
See application file for complete search history.

(56) References Cited

U.S. PATENT DOCUMENTS

| | | | |
|---|---|---|---|
| 7,799,672 B2 | 9/2010 | Hashimoto et al. | |
| 7,847,334 B2 | 12/2010 | Katsumata et al. | |
| 7,910,432 B2 | 3/2011 | Tanaka et al. | |
| 2012/0052674 A1* | 3/2012 | Lee | H01L 27/11578 438/591 |

(Continued)

*Primary Examiner* — Cheung Lee
*Assistant Examiner* — Stephen C Smith
(74) *Attorney, Agent, or Firm* — Finnegan, Henderson, Farabow, Garrett & Dunner, L.L.P.

(57) ABSTRACT

According to one embodiment, an insulating layer is provided above a stairstep portion of a stacked body. A first cover film is provided between the stairstep portion and the insulating layer. The first cover film is of a material different from the insulating layer. A separation portion divides the stacked body and the insulating layer. A second cover film is provided at a side surface of the insulating layer on the separation portion side. The second cover film is of a material different from the insulating layer.

9 Claims, 33 Drawing Sheets

(56) References Cited

U.S. PATENT DOCUMENTS

| | | | |
|---|---|---|---|
| 2012/0112171 A1* | 5/2012 | Hattori | H01L 27/1157 257/40 |
| 2012/0211821 A1* | 8/2012 | Matsumoto | H01L 27/11575 257/324 |
| 2013/0087846 A1* | 4/2013 | Lee | H01L 27/11582 257/324 |
| 2014/0054787 A1 | 2/2014 | Eun et al. | |

* cited by examiner

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from U.S. Provisional Patent Application 62/279,239, filed on Jan. 15, 2016; the entire contents of which are incorporated herein by reference.

FIELD

Embodiments described herein relate generally to a semiconductor device and a method for manufacturing a semiconductor device.

BACKGROUND

A structure has been proposed in which a plurality of electrode layers of a three-dimensional memory device are patterned into a stairstep configuration as a contact structure for connecting the electrode layers to a control circuit. An insulating layer is formed on the stairstep portion; and contact vias that pierce the insulating layer reach the electrode layers of each level. A structure also has been proposed in which an air gap is made between the electrode layers.

DETAILED DESCRIPTION

According to one embodiment, a semiconductor device includes a substrate, a stacked body, a first columnar portion, an insulating layer, a first cover film, a separation portion, and a second cover film. The stacked body is provided above the substrate. The stacked body includes a plurality of electrode layers stacked with an insulator interposed. The stacked body includes a stairstep portion in which the electrode layers are arranged in a stairstep configuration with a difference in levels in a first direction. The first columnar portion includes a semiconductor body and a stacked film. The semiconductor body extends in a stacking direction through the stacked body. The stacked film includes a charge storage portion. The stacked film is provided between the semiconductor body and the electrode layers. The insulating layer is provided above the stairstep portion. The first cover film is provided between the stairstep portion and the insulating layer. The first cover film is of a material different from the insulating layer. The separation portion extends in the stacking direction and the first direction. The separation portion divides the stacked body and the insulating layer in a second direction intersecting the first direction. The second cover film is provided at a side surface of the insulating layer on the separation portion side. The second cover film is of a material different from the insulating layer.

For example, a semiconductor memory device that includes a memory cell array having a three-dimensional structure is described as a semiconductor device in the embodiment.

Figure 1:
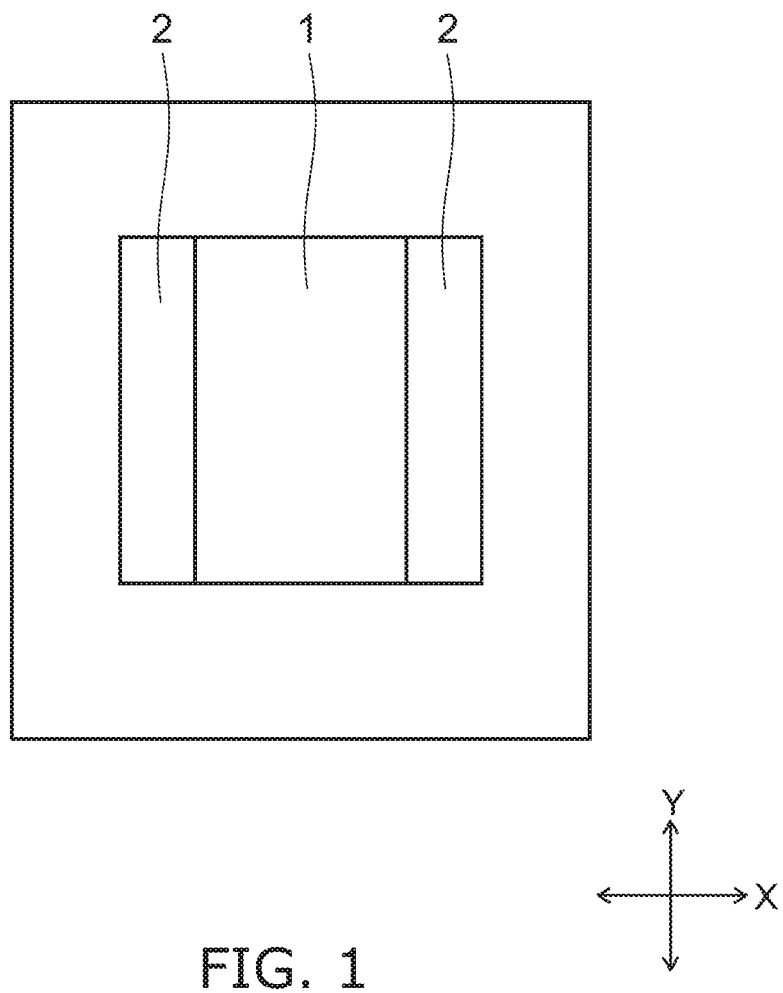
FIG. 1 is a schematic plan view showing an example of an arrangement of a memory cell array and a stairstep portion of a semiconductor device of an embodiment.

FIG. 1 is a schematic plan view showing an example of the planar layout of the semiconductor device of the embodiment.

The semiconductor device of the embodiment includes a memory cell array 1, and a stairstep portion 2 provided in a region outside the memory cell array 1. The memory cell array and the stairstep portion 2 are provided on the same substrate.

Figure 2:
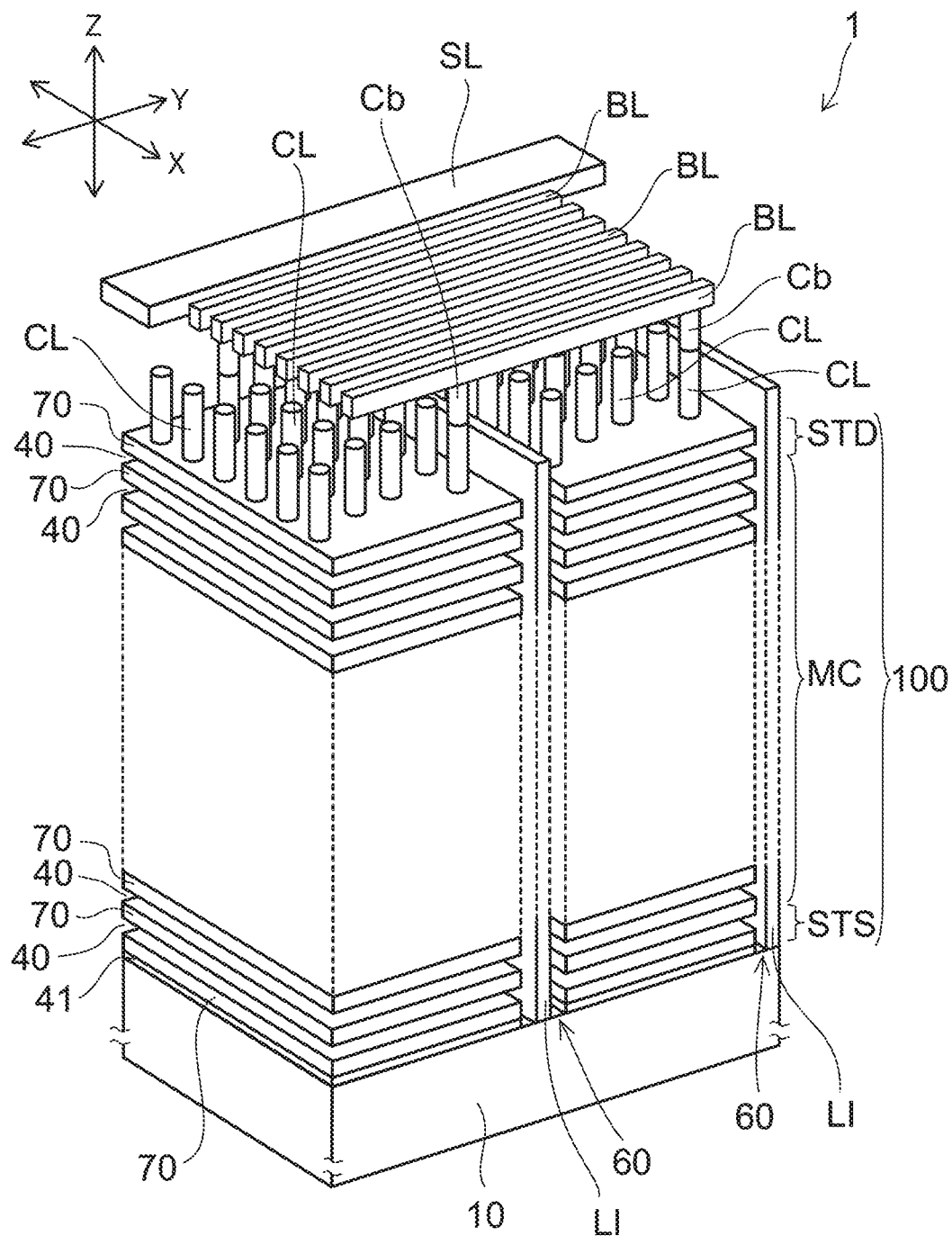
FIG. 2 is a schematic perspective view of the memory cell array of the embodiment.

FIG. 2 is a schematic perspective view of the memory cell array 1 of the embodiment.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 2.

The memory cell array 1 includes the substrate 10, a stacked body 100 stacked on the major surface of the substrate 10, a plurality of columnar portions CL, a plurality of separation portions 60, and upper layer interconnects provided above the stacked body 100. In FIG. 2, for example, bit lines BL and a source line SL are shown as the upper layer interconnects.

Figure 3:
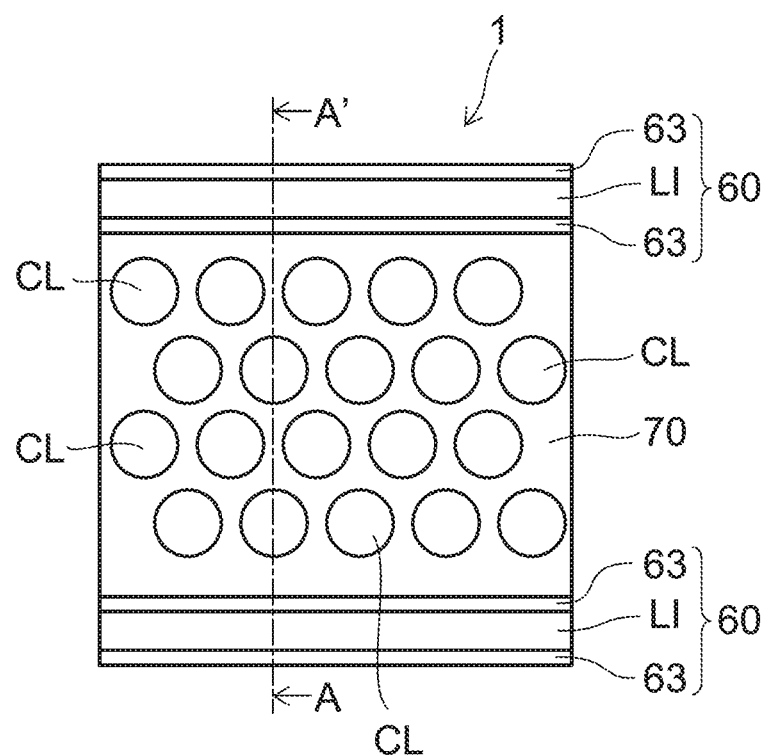
FIG. 3 is a schematic plan view of the memory cell array of the embodiment.

FIG. 3 is a schematic plan view showing an example of the planar layout of the columnar portions CL.

Figure 4:
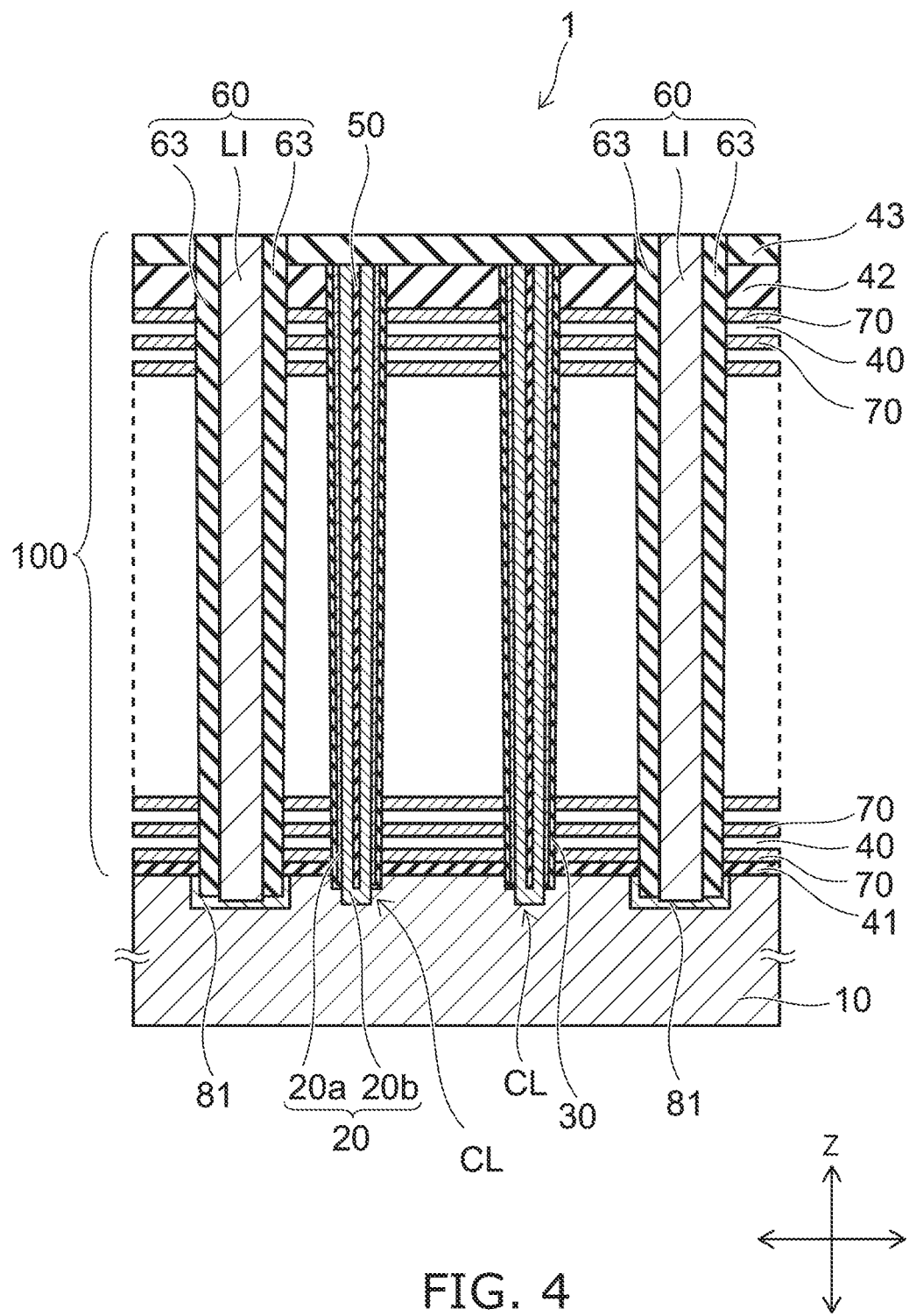
FIG. 4 is an A-A' cross-sectional view of FIG. 3.

FIG. 4 is an A-A' cross-sectional view of FIG. 3.

The columnar portions CL are formed in circular column or elliptical columnar configurations extending in the stacking direction (the Z-direction) through the stacked body 100. The separation portions 60 spread in the X-direction and the stacking direction of the stacked body 100 (the Z-direction), and divide the stacked body 100 into a plurality of blocks (or finger portions) in the Y-direction.

For example, the columnar portions CL have a staggered arrangement. Or, the columnar portions CL may have a square lattice arrangement along the X-direction and the Y-direction.

As shown in FIG. 2, the bit lines BL are provided above the stacked body 100. The bit lines BL are, for example, metal films extending in the Y-direction. The bit lines BL are separated from each other in the X-direction.

The upper ends of semiconductor bodies 20 of the columnar portions CL described below are connected to the bit lines BL via contact portions Cb shown in FIG. 2. The columnar portions CL are connected to one common bit line BL. The columnar portions CL that are connected to the common bit line BL include one columnar portion CL selected from each block (or finger portion) separated in the Y-direction by the separation portions 60.

As shown in FIG. 4, the stacked body 100 includes a plurality of electrode layers 70 stacked on the major surface of the substrate 10. The electrode layers 70 are stacked in a direction (the Z-direction) perpendicular to the major surface of the substrate 10 with an air gap 40 which is an insulator interposed. The electrode layers 70 are metal layers and are, for example, tungsten layers or molybdenum layers.

An insulating film 41 is provided between the major surface of the substrate 10 and the lowermost electrode layer 70. An insulating film 42 is provided on the uppermost electrode layer; and a third cover film (an insulating film) 43 is provided on the insulating film 42. The third cover film 43 covers the upper ends of the columnar portions CL.

Figure 5A:
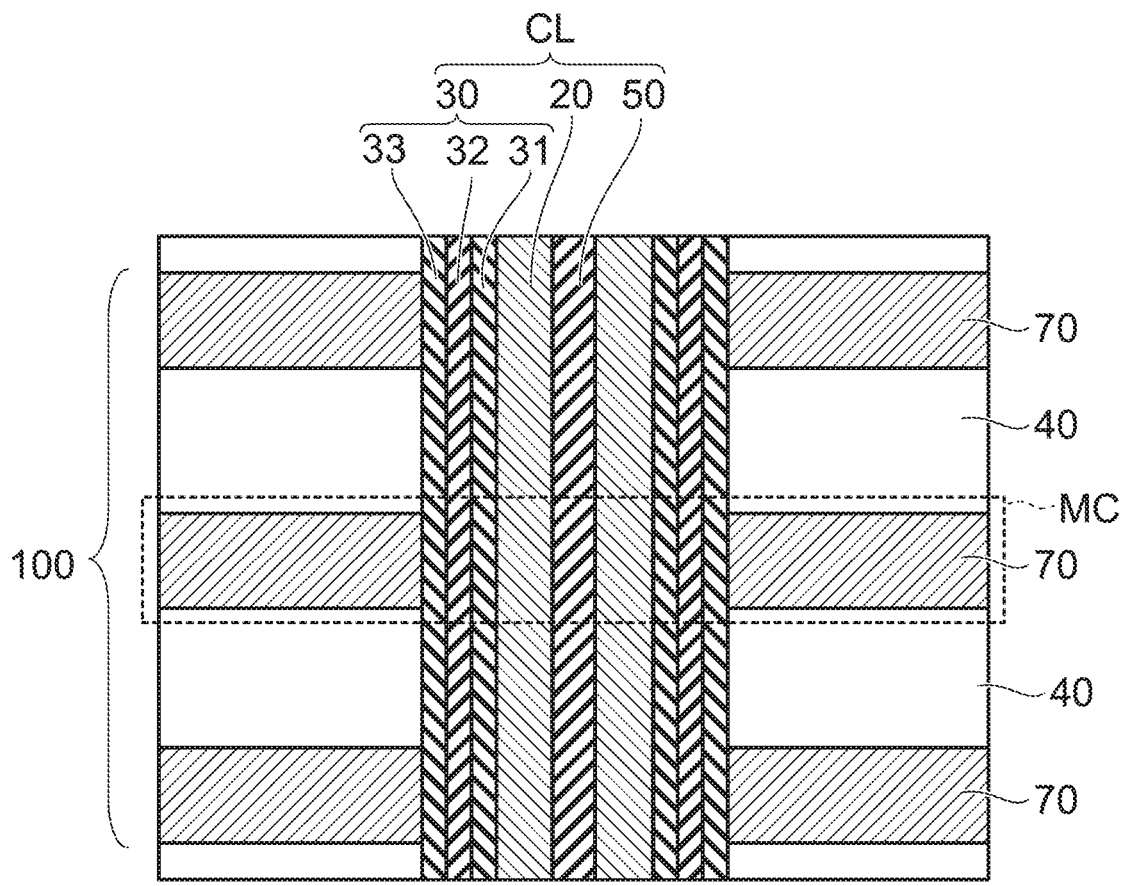
FIG. 5A is an enlarged cross-sectional view of one portion of FIG. 4.

FIG. 5A is an enlarged cross-sectional view of the one portion of FIG. 4.

Figure 5B:
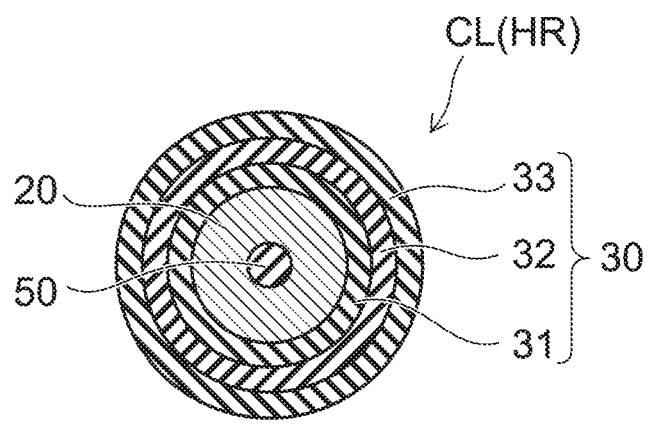
FIG. 5B is a cross-sectional view of a columnar portion of the embodiment.

FIG. 5B is a cross-sectional view of the columnar portion CL. FIG. 5B shows a cross section in a direction parallel to the XY plane.

The columnar portion CL includes a memory film 30, a semiconductor body 20, and an insulative core film 50. The semiconductor body 20, the memory film 30, and the core film 50 extend to be continuous along the stacking direction of the stacked body 100.

The semiconductor body 20 extends in a pipe-like configuration in the stacking direction (the Z-direction) through the stacked body 100. The memory film 30 is provided between the electrode layers 70 and the semiconductor body 20, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contact portion Cb shown in FIG. 2.

As shown in FIG. 5A, the memory film 30 is a stacked film that includes a tunneling insulating film 31, a charge storage film (a charge storage portion) 32, and a blocking insulating film 33. The blocking insulating film 33, the charge storage film 32, and the tunneling insulating film 31 are provided in order from the electrode layer 70 side between the electrode layer 70 and the semiconductor body 20. The tunneling insulating film 31 contacts the semiconductor body 20. The charge storage film 32 is provided between the blocking insulating film 33 and the tunneling insulating film 31.

The semiconductor body 20, the memory film 30, and the electrode layer 70 are included in a memory cell MC. One memory cell MC is schematically illustrated by a broken line in FIG. 5A. The memory cell MC has a vertical transistor structure in which the electrode layer 70 surrounds, with the memory film 30 interposed, the periphery of the semiconductor body 20.

In the memory cell MC having the vertical transistor structure, for example, the semiconductor body 20 is a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of electrons from the electrode layer 70 into the columnar portion CL.

The blocking insulating film 33 includes, for example, a silicon oxide film. Or, the blocking insulating film 33 is a stacked film of a silicon oxide film and a film (e.g., a metal oxide film) that has a higher dielectric constant than the silicon oxide film. The film (the metal oxide film) that has the high dielectric constant may be provided on the electrode layer 70 side; and a silicon oxide film may be provided between the charge storage film 32 and the film having the high dielectric constant.

As shown in FIG. 2, a drain-side select transistor STD is provided at the upper layer portion of the stacked body 100 (the upper end portion of the columnar portion CL). A source-side select transistor STS is provided at the lower layer portion of the stacked body 100 (the lower end portion of the columnar portion CL). At least the uppermost electrode layer 70 functions as a control gate of the drain-side select transistor STD. At least the lowermost electrode layer 70 functions as a control gate of the source-side select transistor STS.

The memory cells MC are provided between the drain-side select transistor STD and the source-side select transistor STS. The memory cells MC, the drain-side select transistor STD, and the source-side select transistor STS are connected in series via the semiconductor body 20 and are included in one memory string. For example, the memory strings have a staggered arrangement in a planar direction parallel to the X-Y plane; and the memory cells MC are provided three-dimensionally in the X-direction, the Y-direction, and the Z-direction.

As shown in FIG. 3 and FIG. 4, the separation portion 60 includes an interconnect portion LI and an insulating film 63. The insulating film 63 is not shown in FIG. 2.

The interconnect portion LI spreads in the X-direction and the Z-direction and is, for example, a film containing a metal. The insulating film 63 is provided at the side surface of the interconnect portion LI. The insulating film 63 is provided between the stacked body 100 and the interconnect portion LI.

As shown in FIG. 4, the lower end of the interconnect portion LI contacts the substrate 10. The lower end of the semiconductor body 20 also contacts the substrate 10. The substrate 10 is, for example, a silicon substrate that is doped with an impurity and is conductive.

A plurality of semiconductor region 81 are formed in the front surface of the substrate 10 where the lower ends of the interconnect portions LI reach the substrate 10. The plurality of semiconductor regions 81 are provided to correspond to the plurality of interconnect portions LI. The semiconductor regions 81 include a p-type semiconductor region 81 and an n-type semiconductor region 81. The p-type semiconductor region 81 supplies holes to the semiconductor body 20 via the substrate 10 in an erasing operation. In a read-out operation, electrons are supplied from the interconnect portion LI to the semiconductor body 20 via the n-type semiconductor region 81 and the substrate 10.

A current can be caused to flow between the semiconductor region 81 and the lower end of the semiconductor body 20 by controlling a potential applied to the lowermost electrode layer 70 provided, with the insulating film 41 interposed, on the front surface (the major surface) of the substrate 10 to induce a channel in the front surface of the substrate 10 between the semiconductor region 81 and the lower end of the semiconductor body 20.

The lowermost electrode layer 70 functions as a control gate for inducing the channel in the front surface of the substrate 10; and the insulating film 41 functions as a gate insulating film. Because the insulating film 41 provided between the front surface of the substrate 10 and the lowermost electrode layer 70 is not an air gap and has a higher dielectric constant than air, high-speed driving is possible due to the capacitive coupling between the lowermost electrode layer 70 and the front surface of the substrate 10.

On the other hand, the air gap 40 is made between the electrode layers 70 which are the control gates of the memory cells MC adjacent to each other in the stacking direction. Therefore, the interconnect capacitance between the electrode layers 70 above and below can be reduced; and high-speed operation of the memory cells MC are possible. Further, the interference between adjacent cells such as the threshold fluctuation due to the capacitive coupling between the electrode layers 70 above and below, etc., can be suppressed.

The stairstep portion 2 will now be described.

Figure 6A:
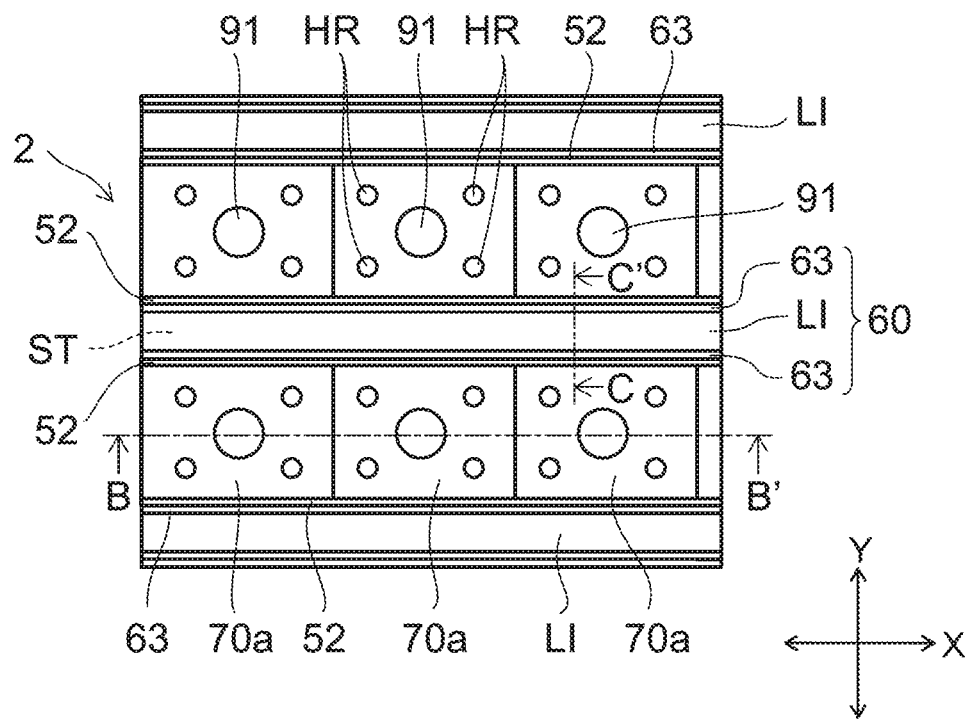
FIG. 6A is a schematic plan view of the stairstep portion.

FIG. 6A is a schematic plan view showing an example of the planar layout of the stairstep portion 2.

Figure 6B:
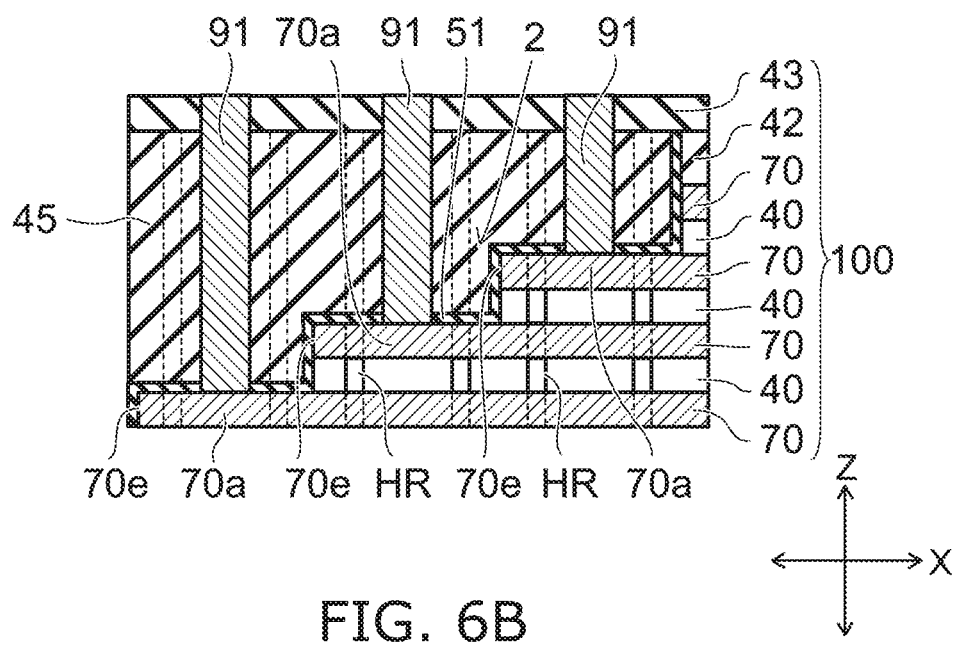
FIG. 6B is a B-B' cross-sectional view of FIG. 6A.

FIG. 6B is a B-B' cross-sectional view of FIG. 6A.

In FIG. 6A and FIG. 6B, for example, the region where the memory cell array 1 is formed continues to the right.

Figure 7A:
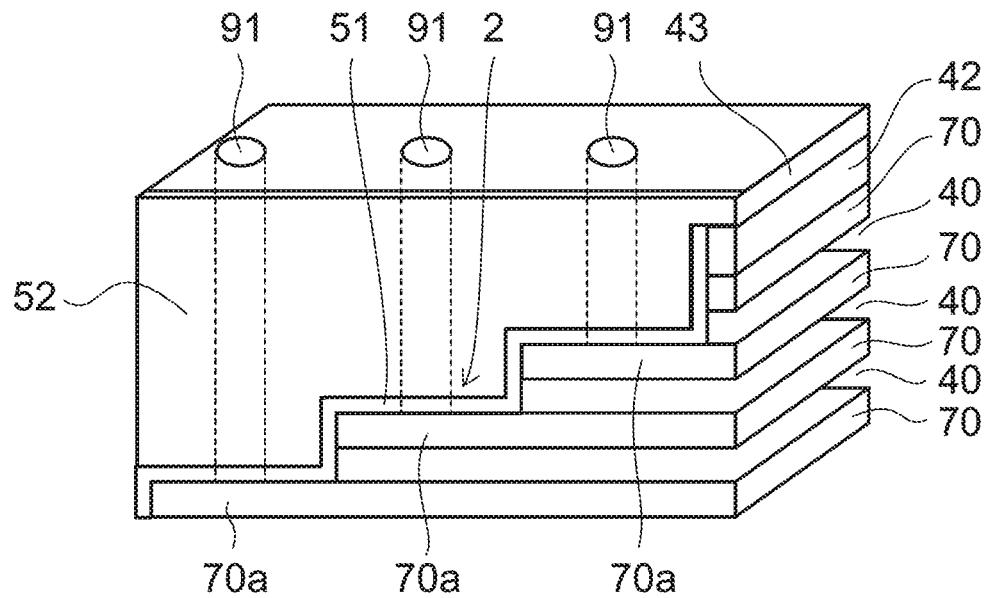
FIG. 7A is a schematic perspective view of a side surface of the stairstep portion on a separation portion side.

FIG. 7A is a schematic perspective view of the side surface of the stairstep portion 2 on the separation portion 60 side.

Figure 7B:
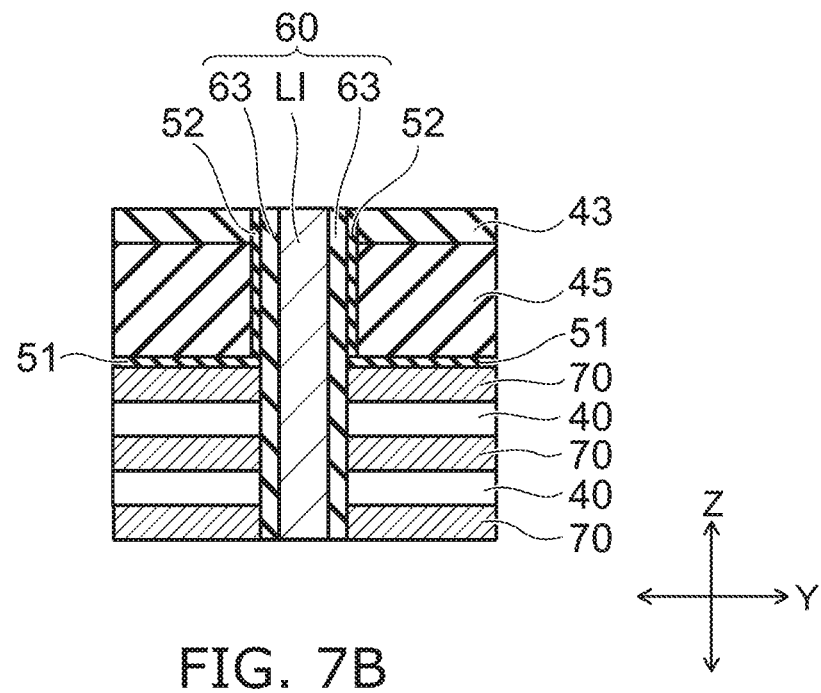
FIG. 7B is a C-C' cross-sectional view of FIG. 6A.

FIG. 7B is a C-C' cross-sectional view of FIG. 6A.

A first cover film 51, an insulating layer 45, and the third cover film 43 shown in FIG. 6B and FIG. 7B are not shown in FIG. 6A.

The stacked body 100 including the electrode layers 70 stacked with the air gap 40 interposed is provided also at the periphery of the region where the memory cell array 1 is formed. The electrode layers 70 and the air gap 40 extend in the X-direction from the region where the memory cell array 1 is formed to the region of the periphery of the region where the memory cell array 1 is formed. The stairstep portion 2 in which the electrode layers 70 are arranged in a stairstep configuration with a difference in levels in the X-direction is provided in the region of the periphery. The electrode layers 70 of the stairstep portion 2 include a plurality of terrace portions 70a arranged in the stairstep configuration in the X-direction. The upper surface of the terrace portion 70a of each of the electrode layers 70 is not covered with the upper electrode layer 70.

As shown in FIG. 6A, the separation portions 60 also extend in the X-direction from the region where the memory cell array 1 is formed to the region where the stairstep portion 2 is formed. The stacked portion of the stacked body 100 including the stairstep portion 2 also is divided into a plurality of blocks (or finger portions) in the Y-direction by the separation portions 60.

As shown in FIG. 6B, the stairstep portion 2 is covered with the first cover film 51; and the insulating layer 45 is provided on the first cover film 51. The first cover film 51 is provided between the stairstep portion 2 and the insulating layer 45. The first cover film 51 is an insulating film of a material different from the insulating layer 45. For example, the insulating layer 45 is a silicon oxide layer; and the first cover film 51 is a silicon nitride film or a metal oxide film. An aluminum oxide film may be an example of the metal oxide film.

The first cover film 51 is provided conformally along the differences in levels of the stairstep portion 2 and covers the upper surface and an edge 70e of the terrace portion 70a. Here, the edge 70e is the edge in the direction in which the terrace portion 70a protrudes in the X-direction.

In the example shown in FIG. 6B, the air gap 40 extends in the X-direction from the region where the memory cell array 1 is formed to the vicinity of the edge 70e of the terrace portion 70a. The first cover film 51 is provided also at the portion opposing the air gap 40 and plugs the air gap 40. The first cover film 51 is provided between the insulating layer 45 and the air gap 40; and the insulating layer 45 is not exposed in the air gap 40.

The insulating layer 45 buries the differences in levels of the stairstep portion 2. Also, the insulating layer 45 is provided to eliminate or relax the difference in levels between the stairstep portion 2 and the memory cell array 1. The third cover film 43 is provided on the insulating layer 45. The third cover film 43 is provided commonly in the stacked body 100 of the memory cell array 1 shown in FIG. 4 and the stacked body 100 including the stairstep portion 2 shown in FIG. 6B.

The third cover film 43 is an insulating film of a material different from the insulating layer 45; and a material similar to that of the first cover film 51 can be used.

The first cover film 51, the insulating layer 45, and the third cover film 43 also are divided in the Y-direction by the separation portions 60.

As shown in FIG. 6B, a plurality of contact vias 91 that extend in the Z-direction are provided inside the insulating layer 45. The contact vias 91 pierce the third cover film 43, the insulating layer 45, and the first cover film 51. The lower ends of the contact vias 91 respectively contact the terrace portions 70a of the corresponding electrode layers 70.

The contact vias 91 are conductors containing a metal; and the contact vias 91 are connected respectively to not-shown upper layer interconnects. For example, the upper layer interconnects are electrically connected to a control circuit formed in the front surface of the substrate 10. The potential of the electrode layer 70 of each layer of the memory cell array 1 is controlled via the contact via 91.

The electrode layer 70 of the memory cell array 1 shown in FIGS. 3 and 4 contacts the side surfaces of the columnar portions (the first columnar portions) CL to surround the side surfaces of the columnar portions CL. The electrode layer 70 is supported by such a physical bond with the columnar portions CL; and the air gap 40 between the electrode layers 70 is maintained.

Also, as shown in FIG. 6A and FIG. 6B, a plurality of columnar portions (second columnar portions) HR are provided in the stacked body 100 where the stairstep portion 2 is formed. The columnar portions HR pierce the insulating layer 45, the first cover film 51, and the stacked body 100 under the first cover film 51, and reach the substrate 10. The third cover film 43 covers the upper ends of the columnar portions HR.

In the example shown in FIG. 6A, one contact via 91 and four columnar portions HR at the periphery of the contact via 91 are disposed every one terrace portion 70a.

The electrode layers 70 including the terrace portions 70a of the stairstep portion 2 contact the side surfaces of the columnar portions HR to surround the side surfaces of the columnar portions HR. The electrode layers 70 of the stairstep portion 2 are supported by such a physical bond with the columnar portions HR; and the air gap 40 between the electrode layers 70 is maintained.

The columnar portions HR can be formed simultaneously when forming the columnar portions CL of the memory cell array 1. In such a case, as shown in FIG. 5B, the columnar portions HR may be formed as stacked films having the same configuration as the columnar portions CL. Or, the columnar portions HR can be pillars of an insulating material formed in a process other than that of the columnar portions CL.

As shown in FIG. 7A and FIG. 7B, a second cover film 52 is provided at the side surface of the insulating layer 45 on the separation portion 60 side. As shown in FIG. 7B, the second cover film 52 is provided between the third cover film 43 and the insulating film 63 of the separation portion 60, and between the insulating layer 45 and the insulating film 63 of the separation portion 60. The second cover film 52 is not provided between the insulating film 63 and the electrode layers 70 of the stairstep portion 2.

The second cover film 52 is an insulating film of a material different from the insulating layer 45; and a material similar to that of the first cover film 51 can be used.

Figure 15:
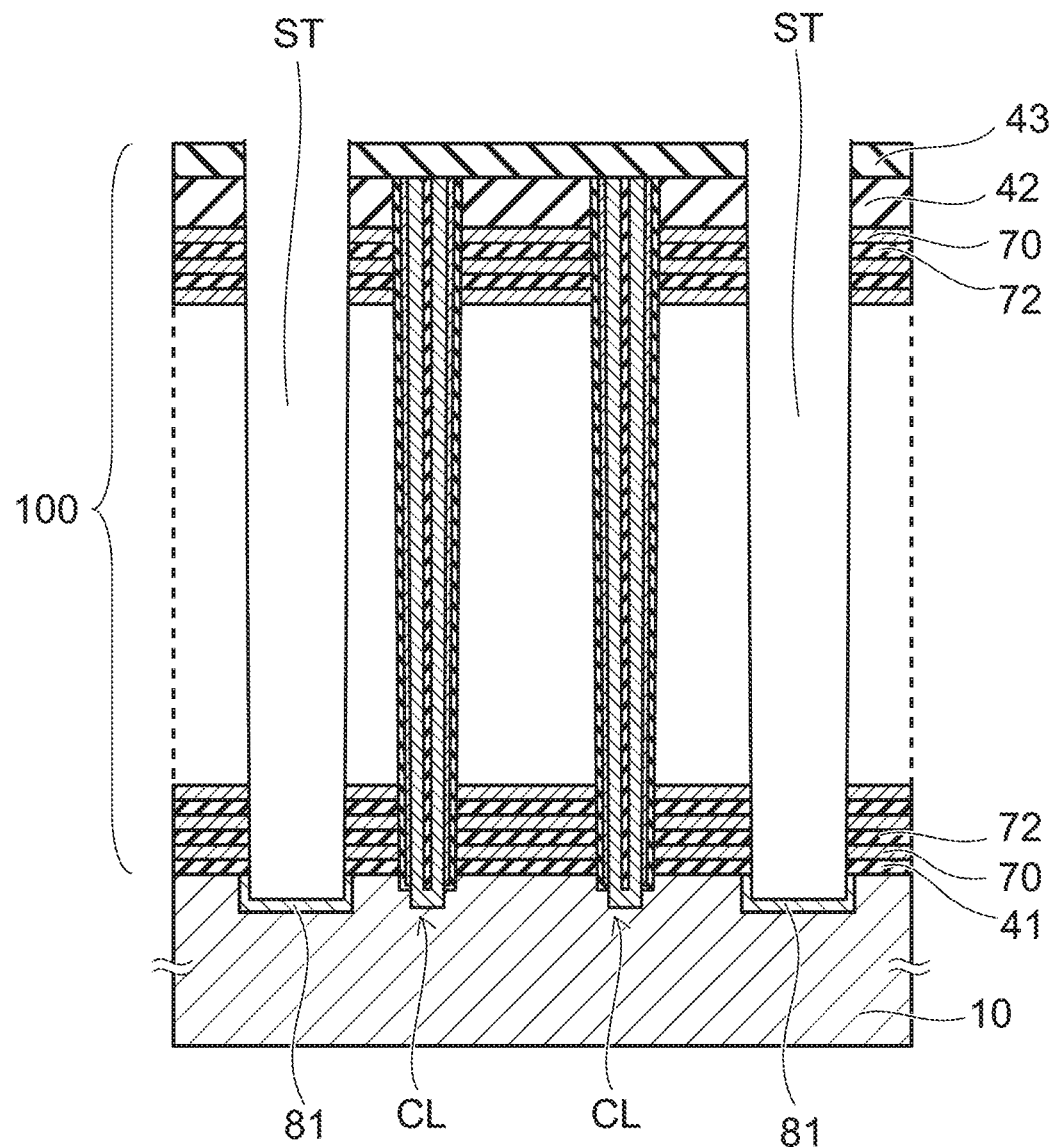
Figure 16:
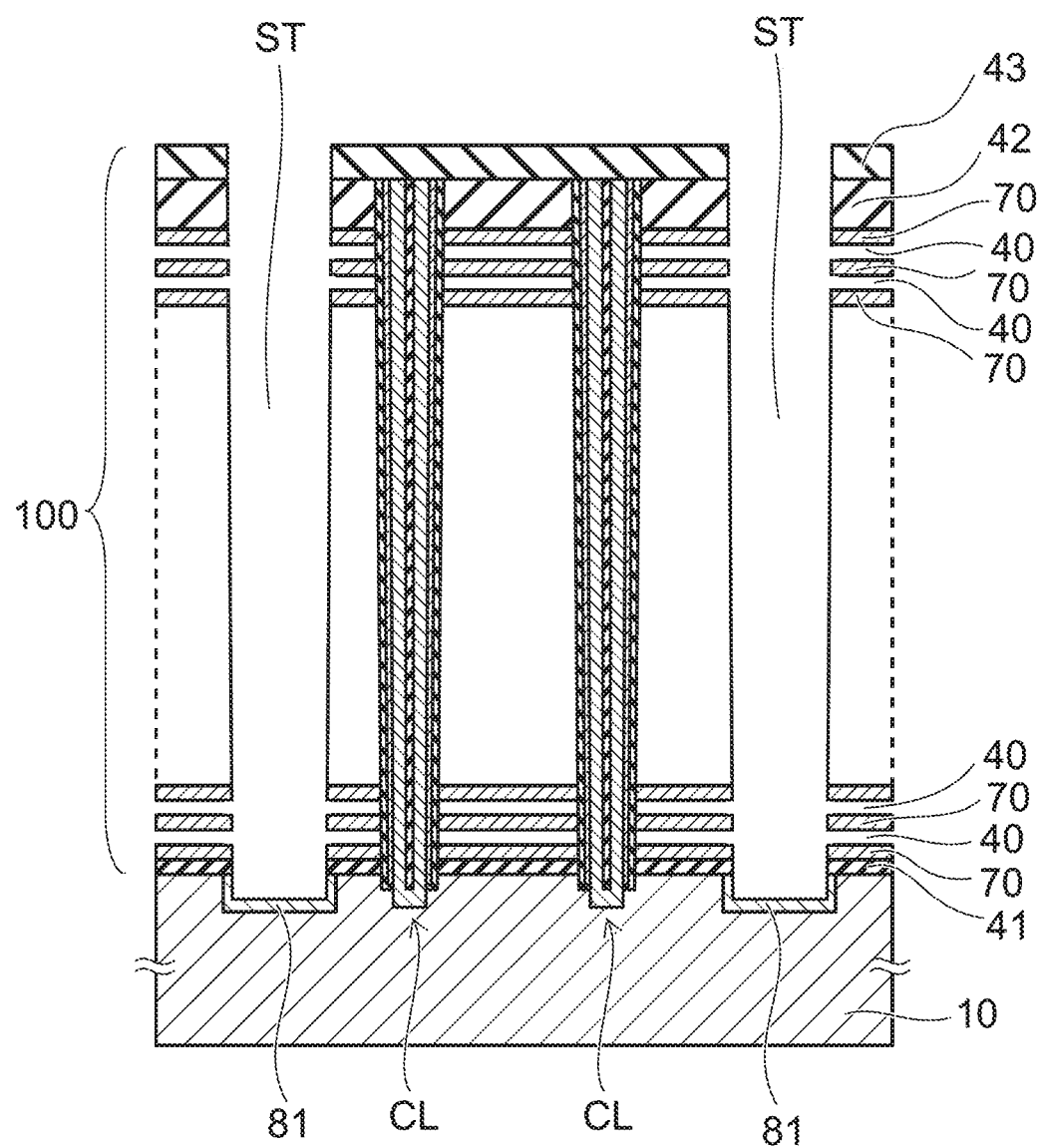

As shown in FIG. 15 described below, a slit ST is made in the stacked body 100; and the insulating film 63 and the interconnect portion LI of the separation portion 60 are formed inside the slit ST. Also, the air gap 40 is made as shown in FIG. 16 by removing sacrificial layers 72 shown in FIG. 15 by etching through the slit ST prior to forming the insulating film 63 and the interconnect portion LI inside the slit ST.

In the etching that removes the sacrificial layers 72, the insulating layer 45 on the stairstep portion 2 is covered with the first cover film 51 formed between the stairstep portion 2 and the insulating layer 45, with the second cover film 52 formed at the side surface of the insulating layer 45 on the slit ST side, and with the third cover film 43 formed on the insulating layer 45, and is not etched.

A method for manufacturing the semiconductor device of the embodiment will now be described.

First, the processes for the stacked body 100 in the region where the memory cell array 1 is formed will be described with reference to FIG. 8 to FIG. 17.

FIG. 8 to FIG. 17 are cross-sectional views corresponding to the A-A' cross section of FIG. 3.

Figure 8:
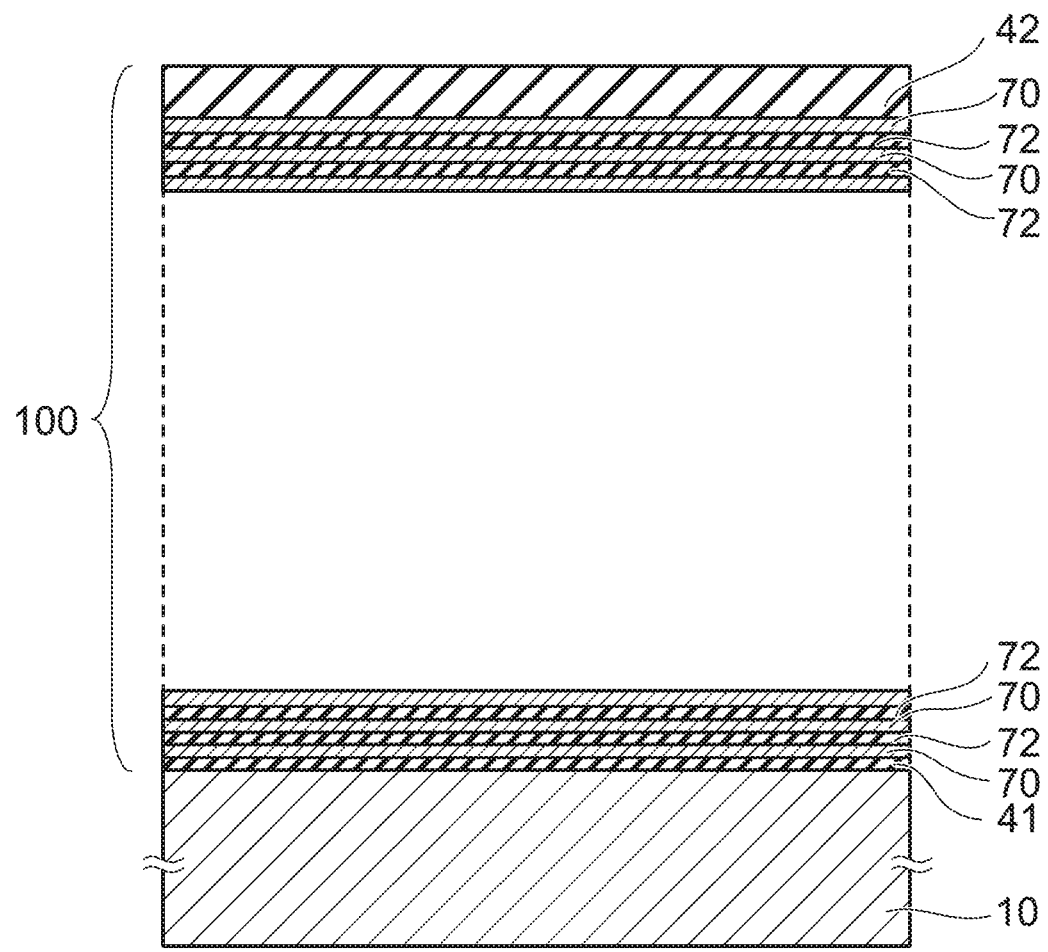
FIGS. 8 to 33B are schematic views showing a method for manufacturing the semiconductor device of the embodiment.

As shown in FIG. 8, the stacked body 100 is formed on the substrate 10. The insulating film 41 is formed on the major surface (the front surface) of the substrate 10; and the electrode layer 70 as the first layer and the sacrificial layer 72 as the second layer are stacked alternately on the insulating film 41. The process of alternately stacking the electrode layer 70 and the sacrificial layer 72 is repeated; and a plurality of electrode layers 70 and a plurality of sacrificial layers 72 are formed on the substrate 10. For example, the electrode layer 70 is a tungsten layer or a molybdenum layer; and the sacrificial layer 72 is a silicon oxide layer.

The lowermost electrode layer 70 is formed on the insulating film 41; and the lowermost sacrificial layer 72 is formed on the lowermost electrode layer 70. The insulating film 42 is formed on the uppermost electrode layer 70.

Figure 9:
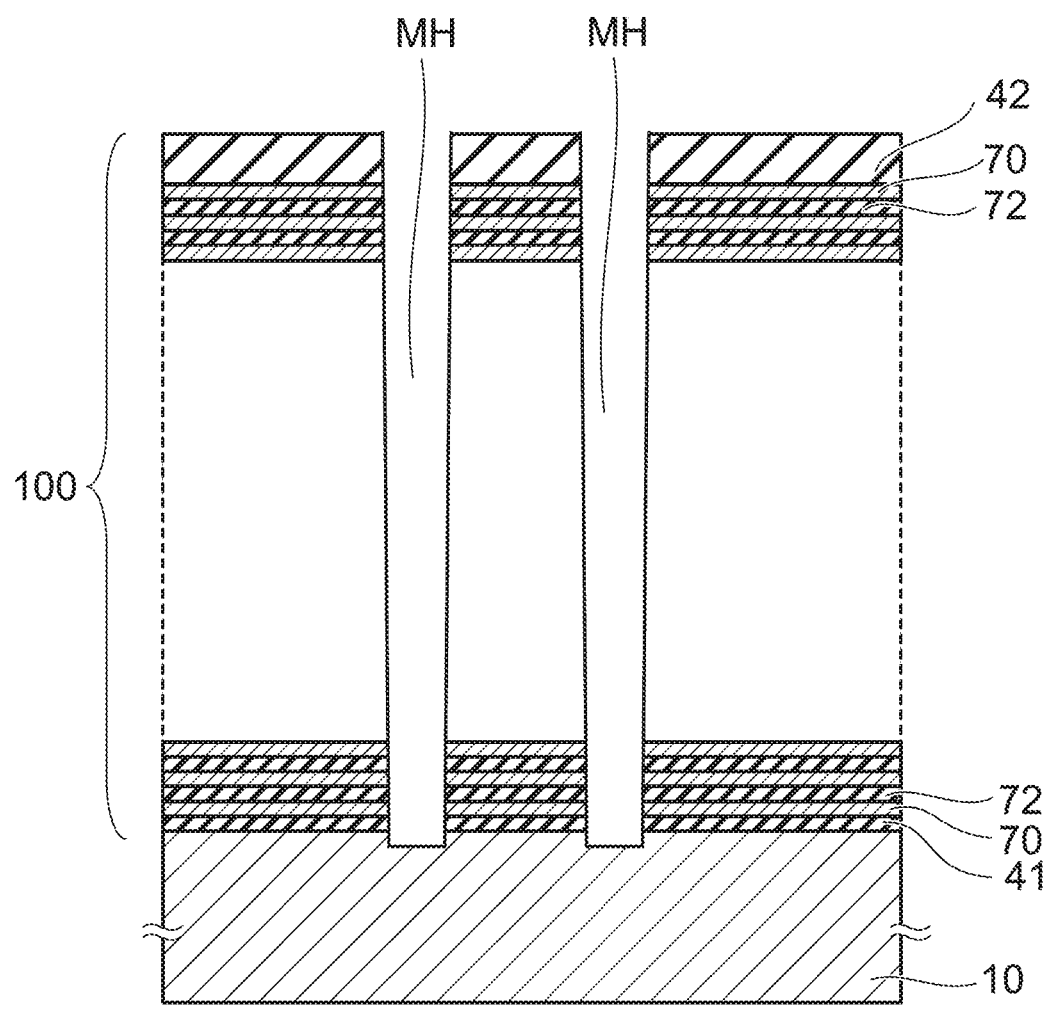

Then, as shown in FIG. 9, a plurality of memory holes MH are made in the stacked body 100. The memory holes MH are made by reactive ion etching (RIE) using a not-shown mask. The memory holes MH extend in the stacking direction of the stacked body 100 (the Z-direction) and reach the substrate 10.

Figure 10:
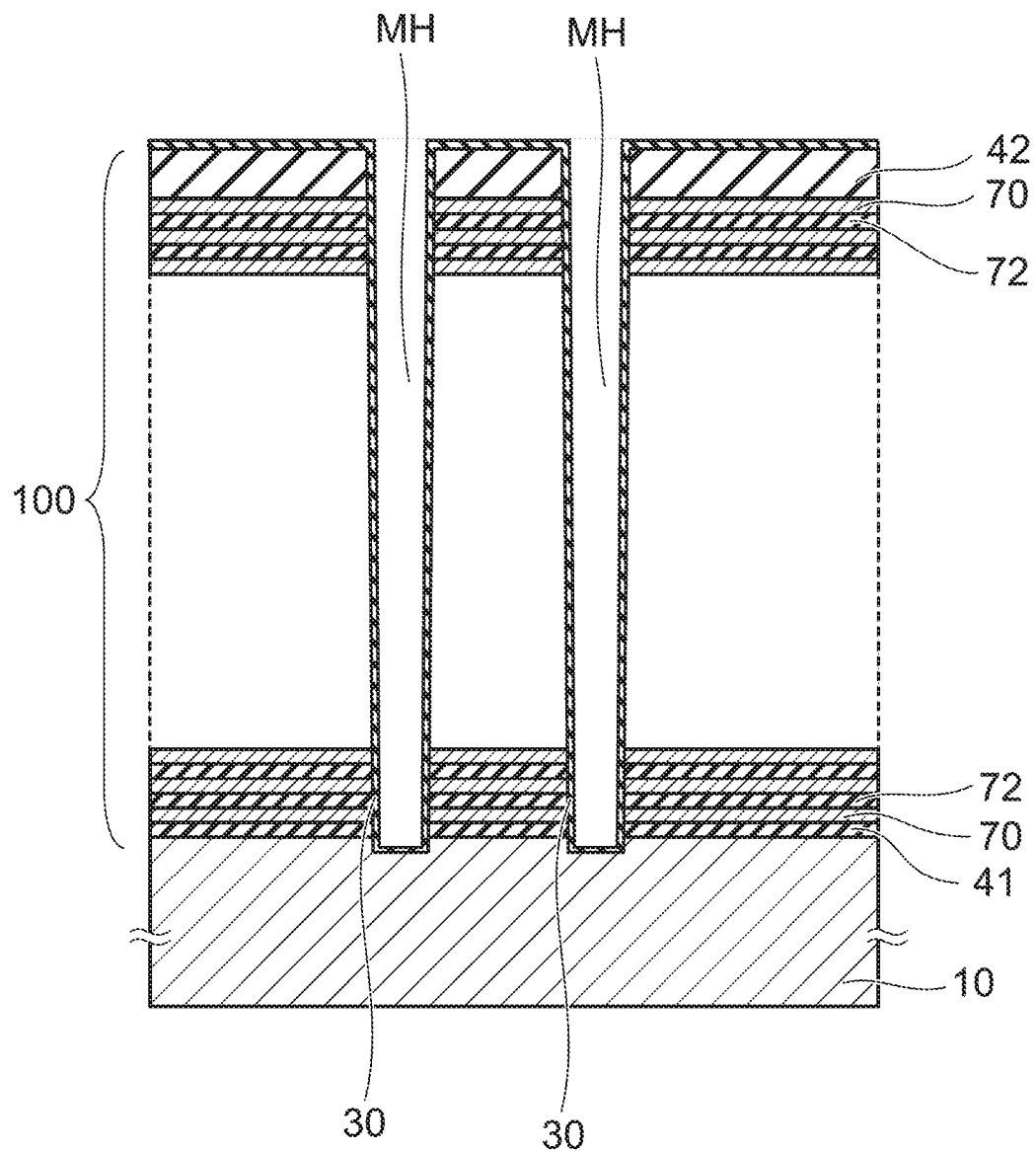

As shown in FIG. 10, the memory film 30 is formed inside the memory holes MH. The memory film 30 is formed conformally along the side surfaces and bottoms of the memory holes MH.

Figure 11:
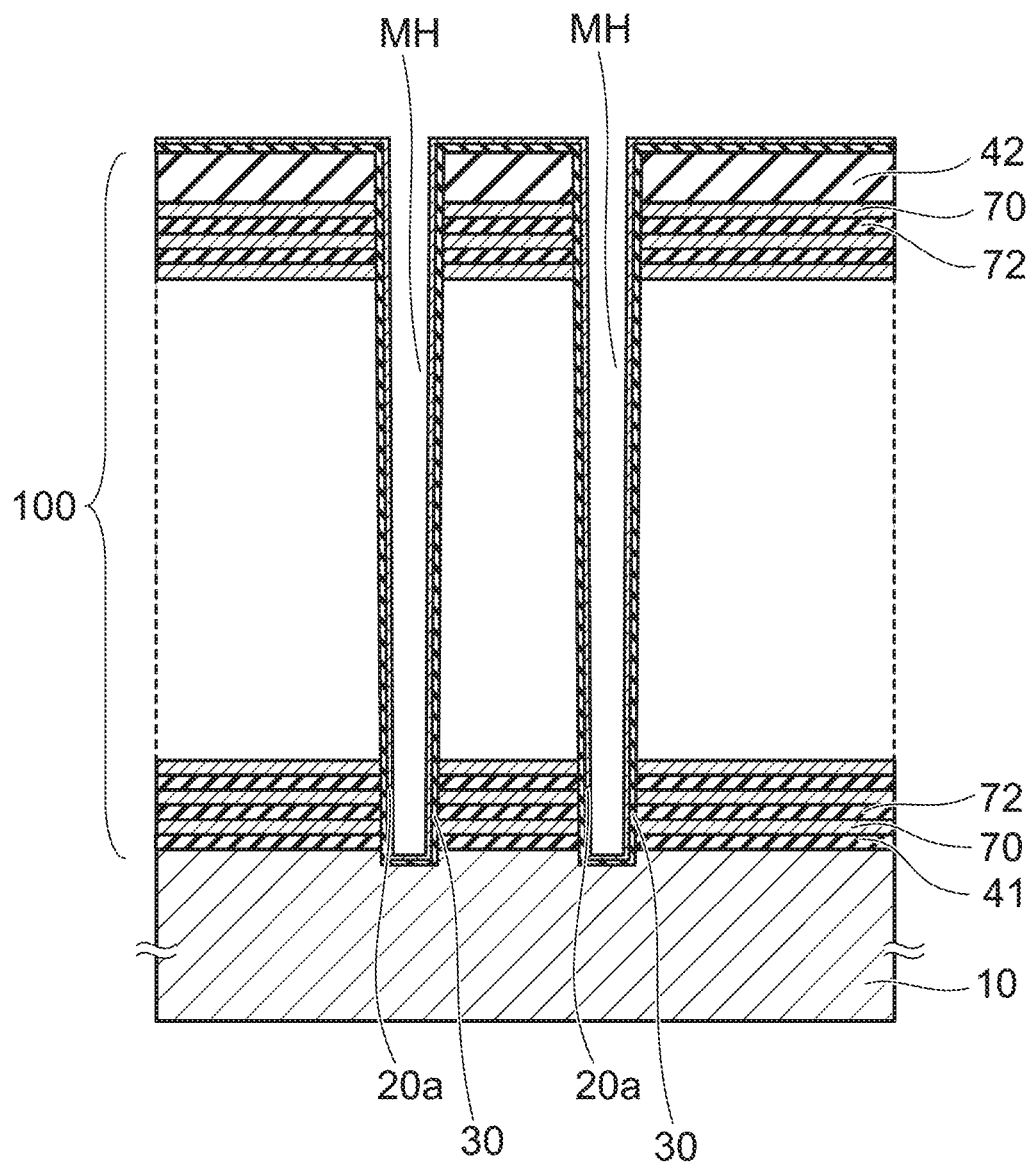

As shown in FIG. 11, a cover film 20a is formed on the inner side of the memory film 30. The cover film 20a is formed conformally along the side surfaces and bottoms of the memory holes MH.

Figure 12:
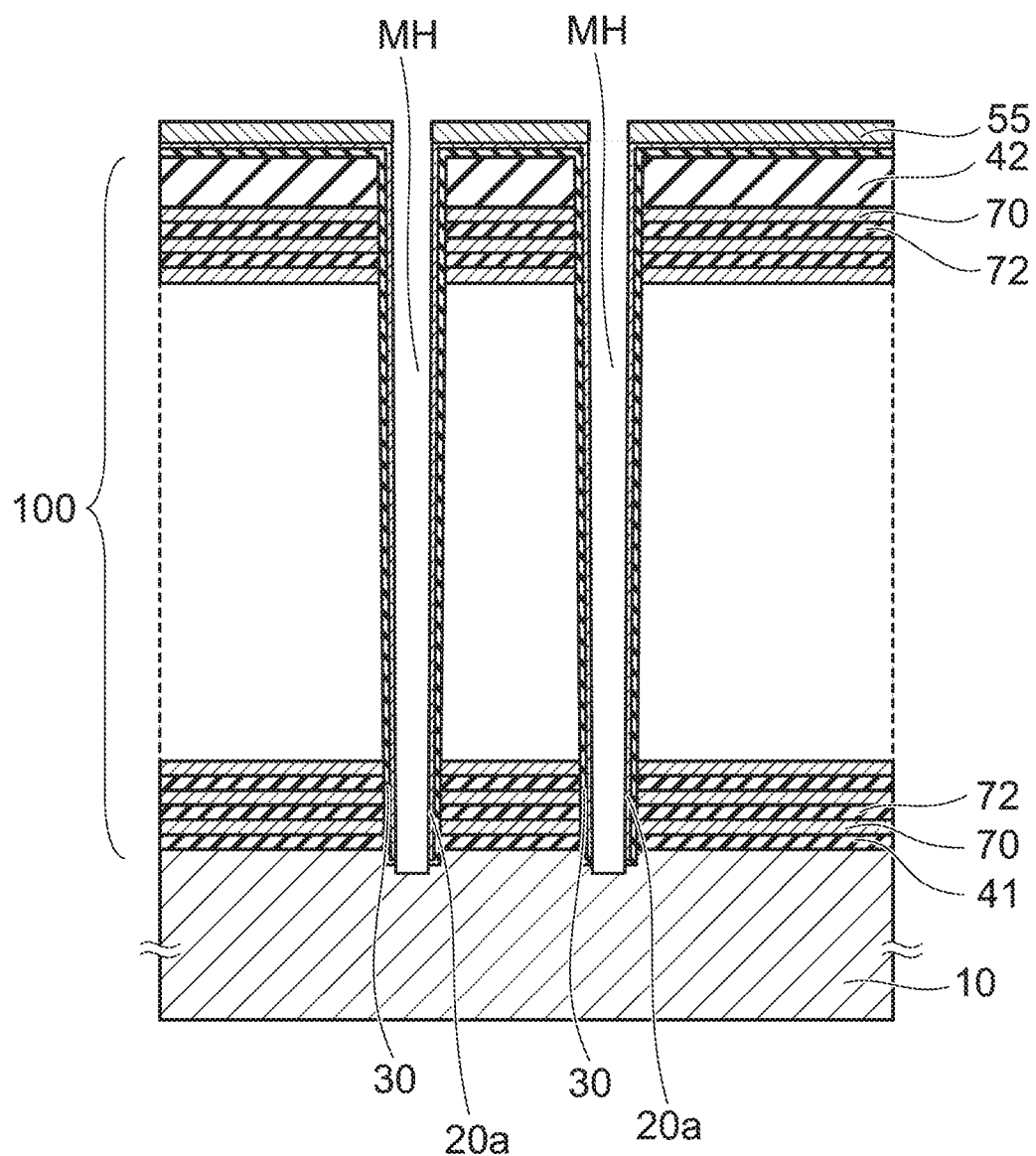

Then, as shown in FIG. 12, a mask layer 55 is formed on the upper surface of the stacked body 100; and the cover film 20a and the memory film 30 that are deposited on the bottoms of the memory holes MH are removed by RIE. In the RIE, the memory film 30 formed on the side surfaces of the memory holes MH is covered with and protected by the cover film 20a and is not damaged by the RIE.

Figure 13:
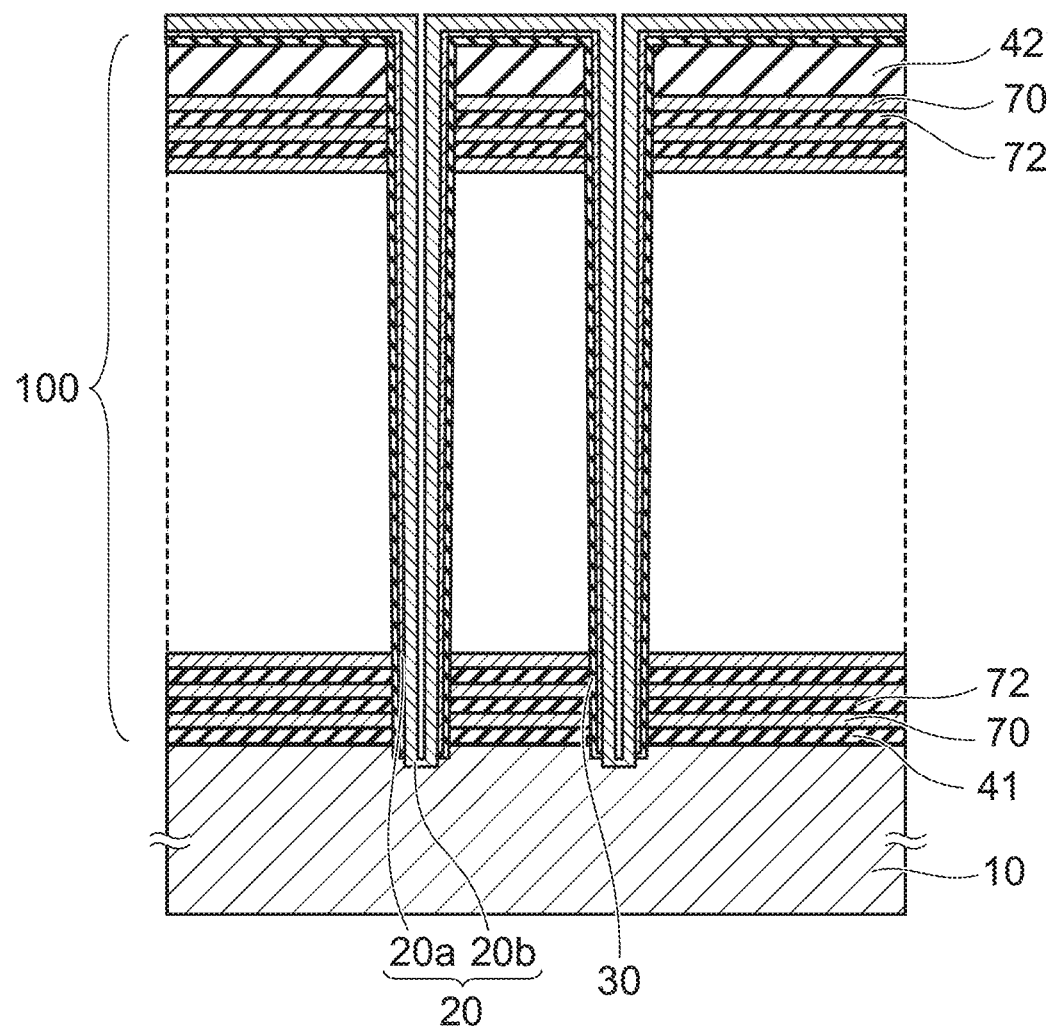

As shown in FIG. 13, a semiconductor film 20b is formed inside the memory holes MH after the mask layer 55 is removed. The semiconductor film 20b is formed on the side surface of the cover film 20a and on the bottoms of the memory holes MH where the substrate 10 is exposed.

For example, after the cover film 20a and the semiconductor film 20b are formed as amorphous silicon films, the cover film 20a and the semiconductor film 20b are crystallized into polycrystalline silicon films by heat treatment. The cover film 20a and the semiconductor film 20b are included in the semiconductor body 20 described above.

Figure 14:
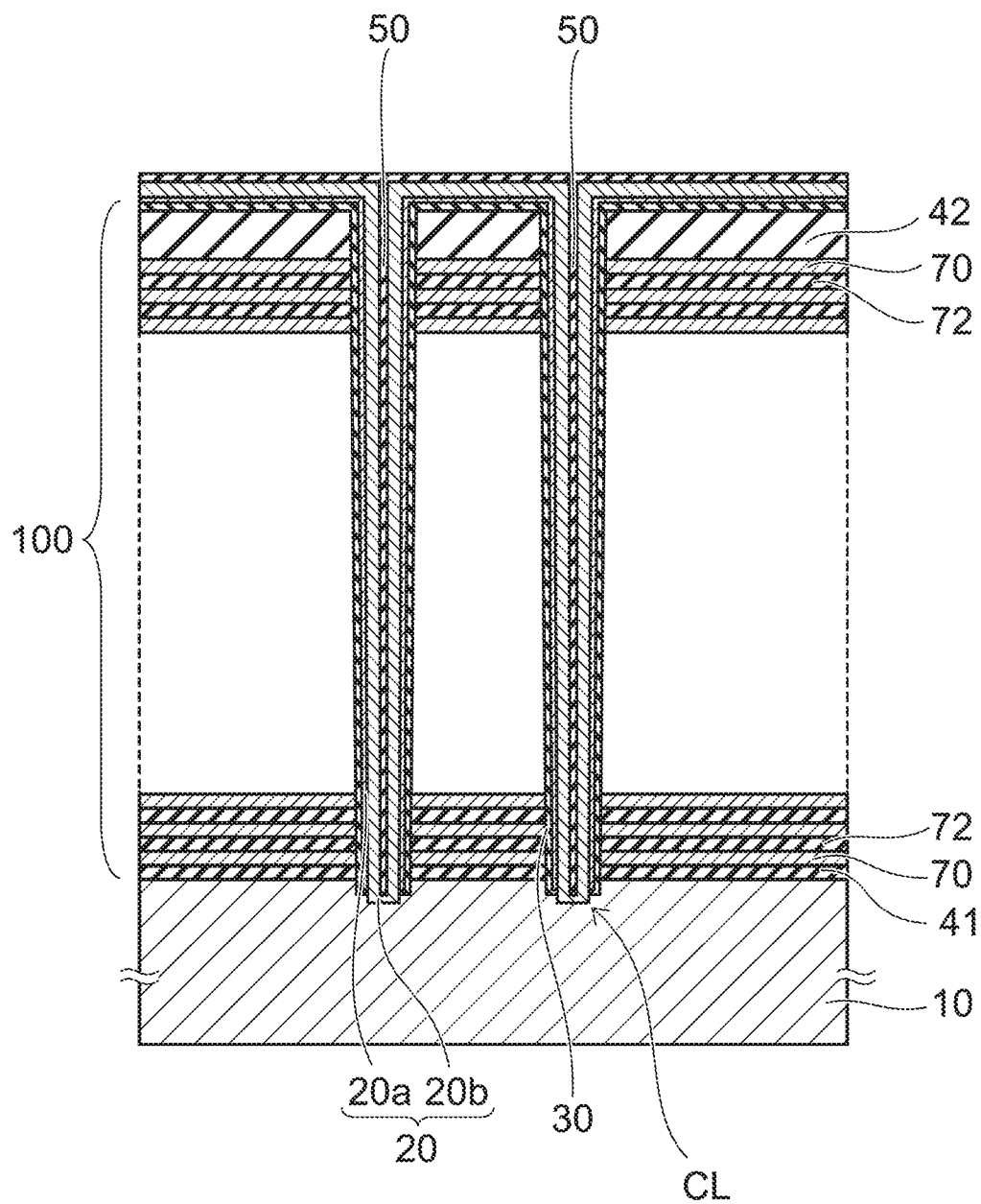

As shown in FIG. 14, the core film 50 is formed on the inner side of the semiconductor film 20b. The columnar portions CL that include the memory film 30, the semiconductor body 20, and the core film 50 are formed inside the stacked body 100.

The films deposited on the insulating film 42 shown in FIG. 14 are removed by chemical mechanical polishing (CMP) or etch-back. Subsequently, as shown in FIG. 15, the third cover film 43 is formed on the insulating film 42. The third cover film 43 covers the upper ends of the columnar portions CL.

Then, a plurality of slits ST that extend in the stacking direction are made in the stacked body 100. The slits ST are made, by RIE using a not-shown mask, in the stacked body 100 including the third cover film 43, the insulating film 42, the electrode layer 70, the sacrificial layer 72, and the insulating film 41. The slits ST pierce the stacked body 100 and reach the substrate 10.

The p-type or n-type semiconductor region 81 is formed in the front surface of the substrate 10 at the bottoms of the slits ST by implanting an impurity into the substrate 10 exposed at the bottoms of the slits ST by ion implantation.

Then, the sacrificial layers 72 are removed by an etchant or an etching gas supplied through the slits ST. For example, the sacrificial layers 72 which are silicon oxide layers are removed using an etchant containing hydrofluoric acid.

The sacrificial layers 72 are removed; and as shown in FIG. 16, the air gap 40 is made between the electrode layers 70 adjacent to each other above and below.

The electrode layers 70 separated from each other in the stacking direction with the air gap 40 interposed are supported by the columnar portions CL. Also, the lower ends of the columnar portions CL are supported by the substrate 10; and the upper ends of the columnar portions CL are supported by the insulating film 42 and the third cover film 43.

Figure 17:
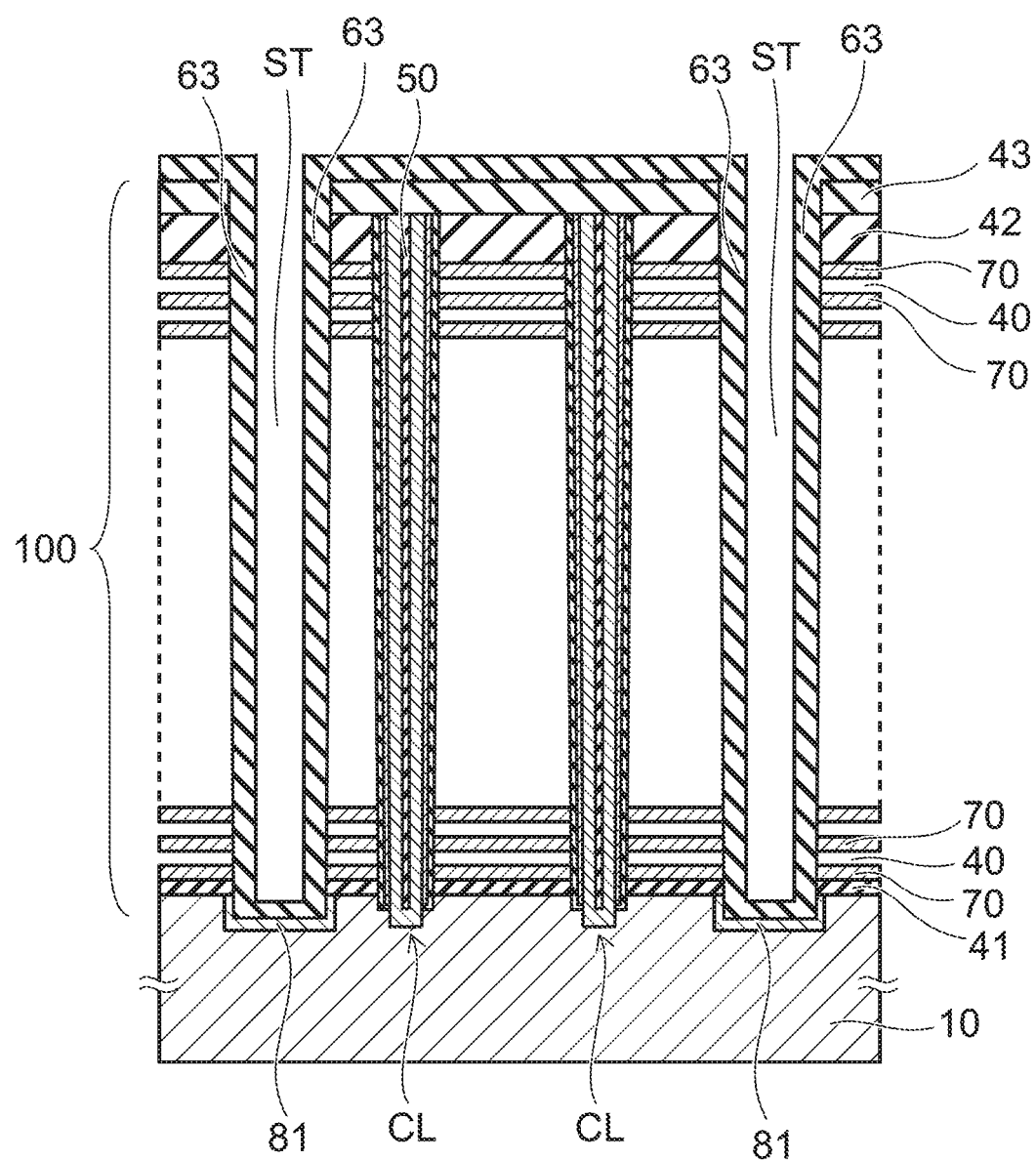

Subsequently, as shown in FIG. 17, the insulating film 63 is formed at the side surfaces and bottoms of the slits ST. After the insulating film 63 formed at the bottoms of the slits ST is removed by RIE, the interconnect portion LI is buried in the inner side of the insulating film 63 inside the slits ST as shown in FIG. 4. The lower end of the interconnect portion LI is connected to the substrate 10 via the semiconductor region 81. Subsequently, the bit lines BL, the source line SL, etc., shown in FIG. 2 are formed.

The processes for the stacked body 100 in the region where the stairstep portion 2 is formed will now be described with reference to FIG. 18A to FIG. 27.

FIG. 18A, FIG. 19A, FIG. 20A, FIG. 21A, FIG. 23A, FIG. 24A, and FIG. 25A are schematic plan views of the region where the stairstep portion 2 is formed.

Figure 18A:
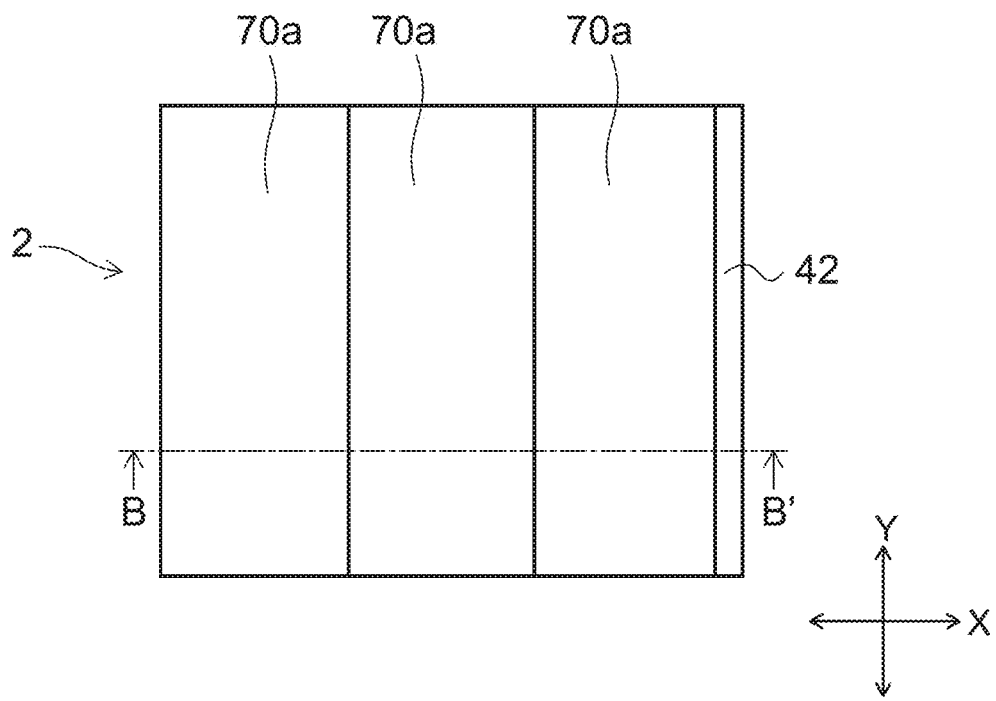
Figure 18B:
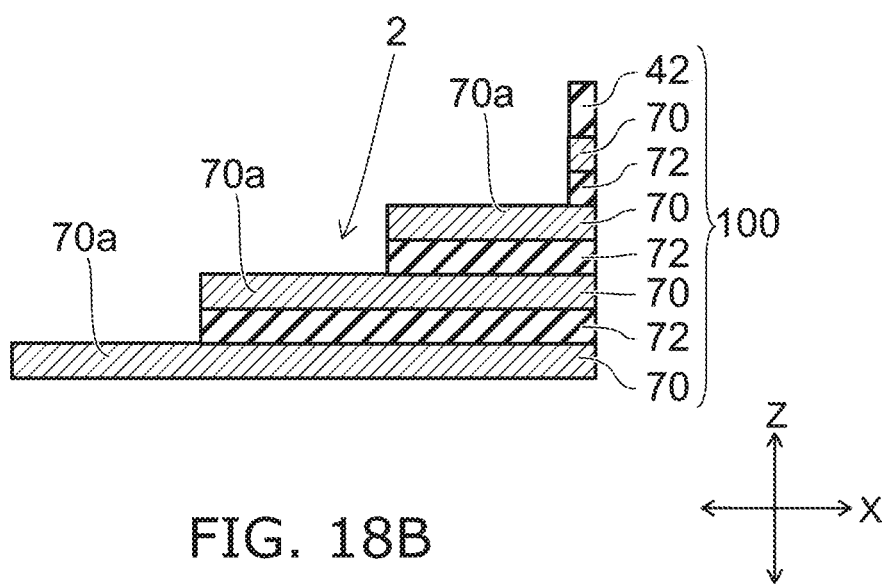
Figure 21A:
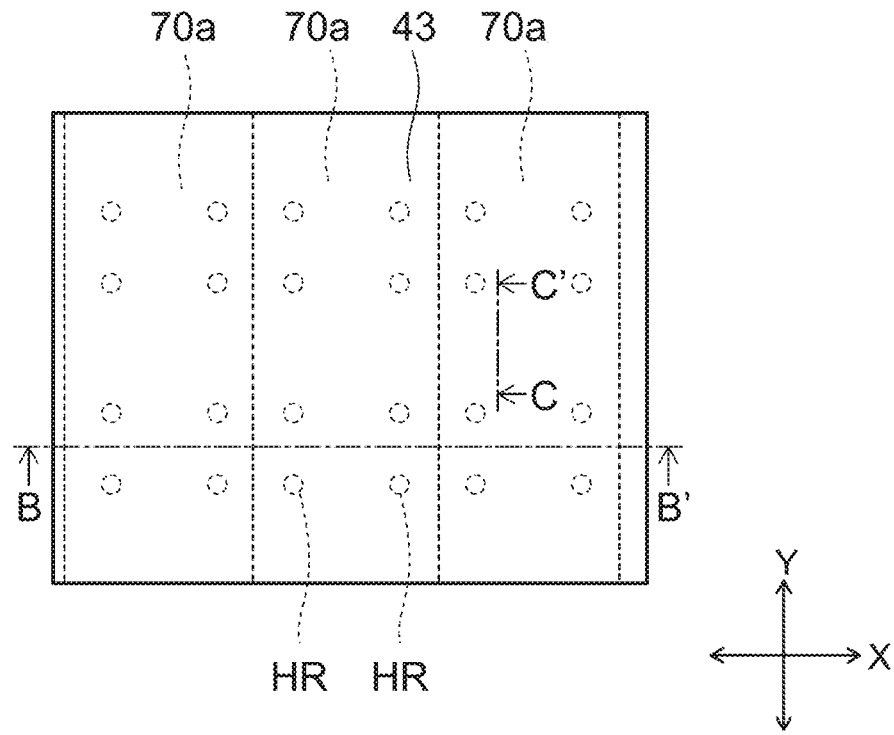
Figure 21B:
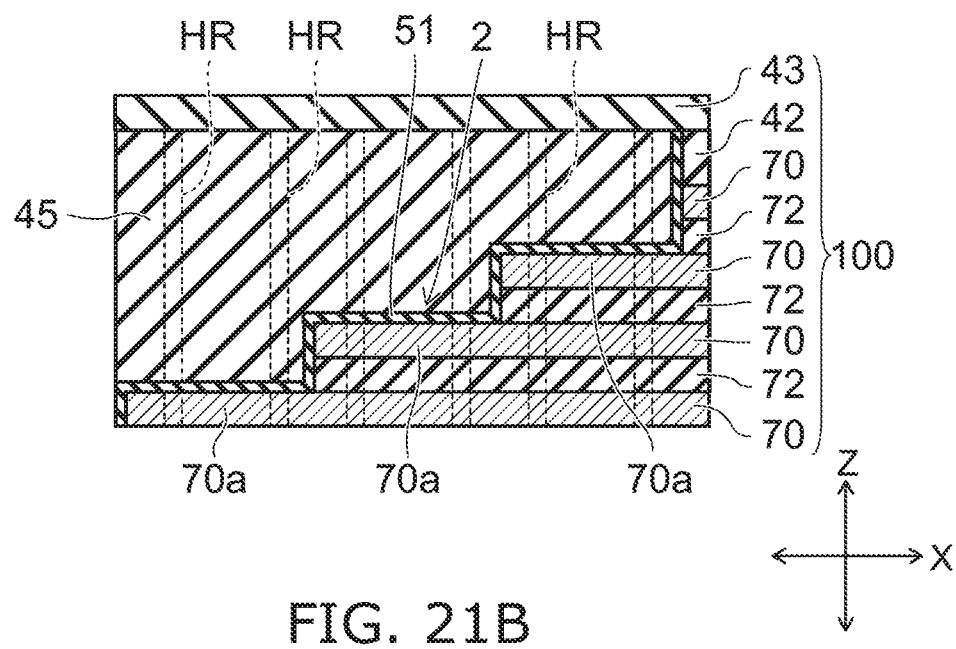
Figure 22:
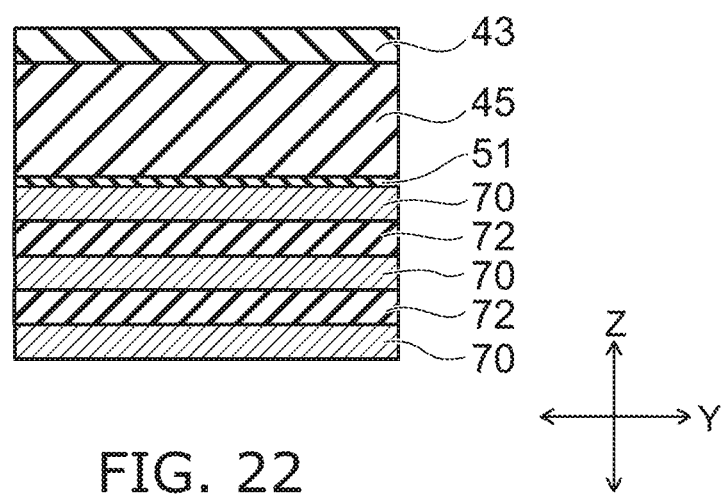
Figure 25A:
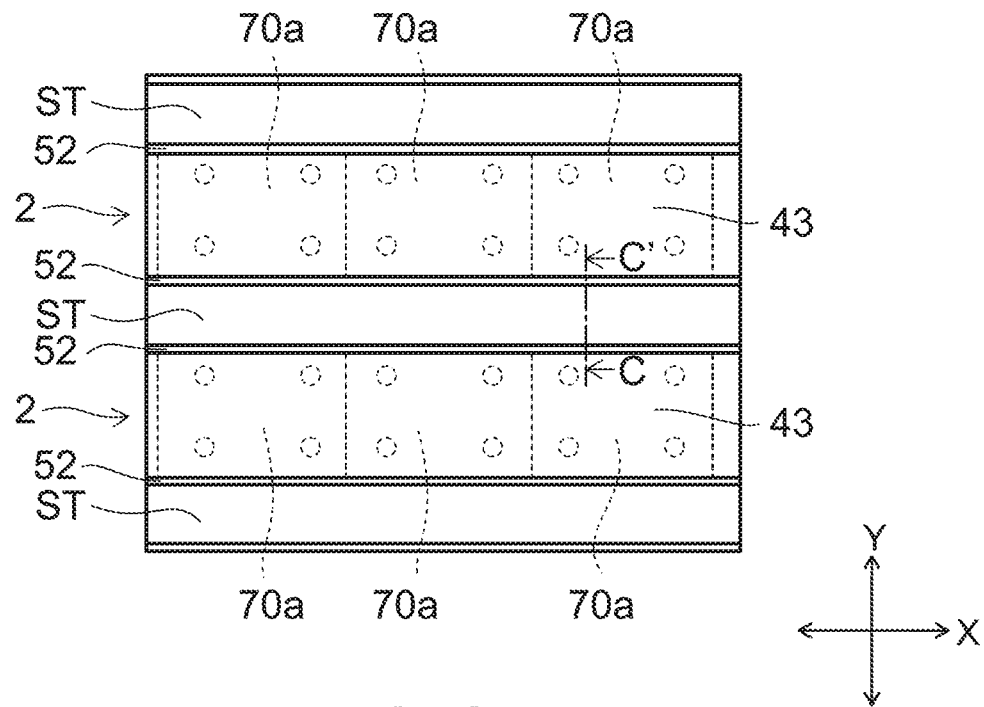
Figure 25B:
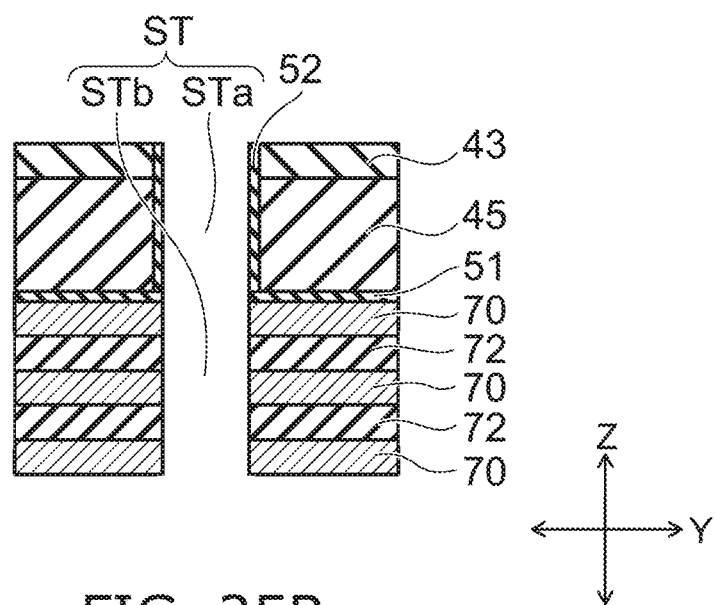
Figure 26A:
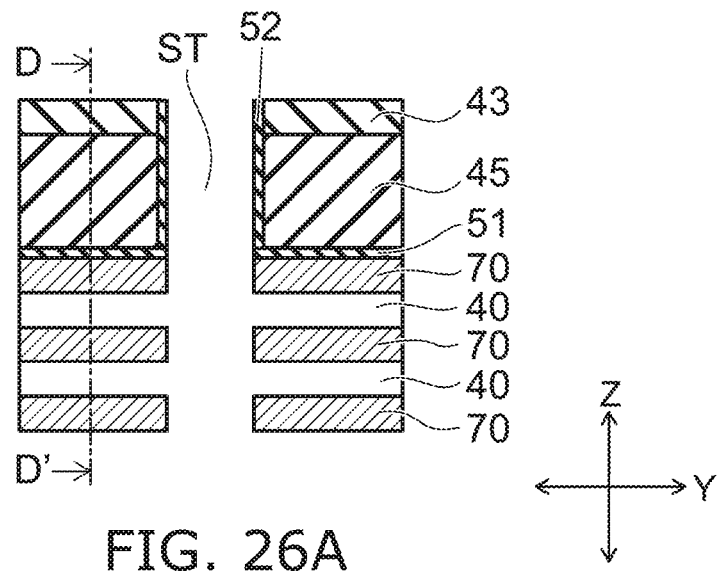
Figure 26B:
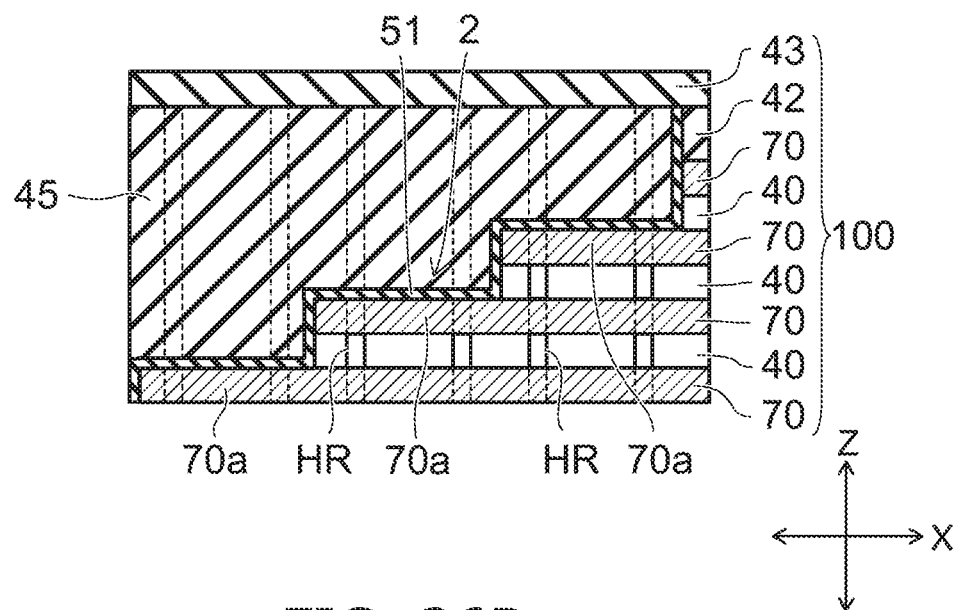
Figure 27:
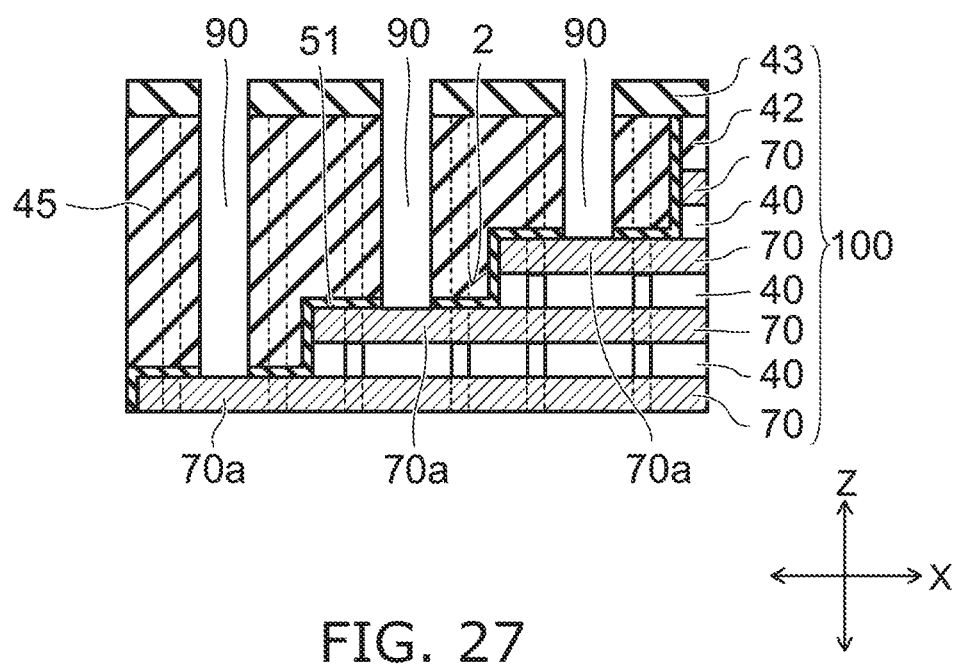

FIG. 18B is a B-B' cross-sectional view of FIG. 18A.
FIG. 19B is a B-B' cross-sectional view of FIG. 19A.
FIG. 20B is a B-B' cross-sectional view of FIG. 20A.
FIG. 21B is a B-B' cross-sectional view of FIG. 21A.
FIG. 22 is a C-C' cross-sectional view of FIG. 21A.
FIG. 23B is a C-C' cross-sectional view of FIG. 23A.
FIG. 24B is a C-C' cross-sectional view of FIG. 24A.
FIG. 25B is a C-C' cross-sectional view of FIG. 25A.
FIG. 26A is a schematic cross-sectional view of the process continuing from FIG. 25B.
FIG. 26B is a D-D' cross-sectional view of FIG. 26A.
FIG. 27 is a schematic cross-sectional view of the process continuing from FIG. 26B.

After the stacked body 100 including the electrode layers 70 and the sacrificial layers 72 is formed, one portion of the stacked body 100 is patterned into a stairstep configuration. For example, the electrode layers 70 and the sacrificial layers 72 are patterned into a stairstep configuration along the X-direction as shown in FIG. 18B by repeating RIE using a not-shown resist film as a mask and reduction of the planar size of the resist film. The electrode layers 70 that are patterned into the stairstep configuration have the terrace portions 70a.

Figure 19A:
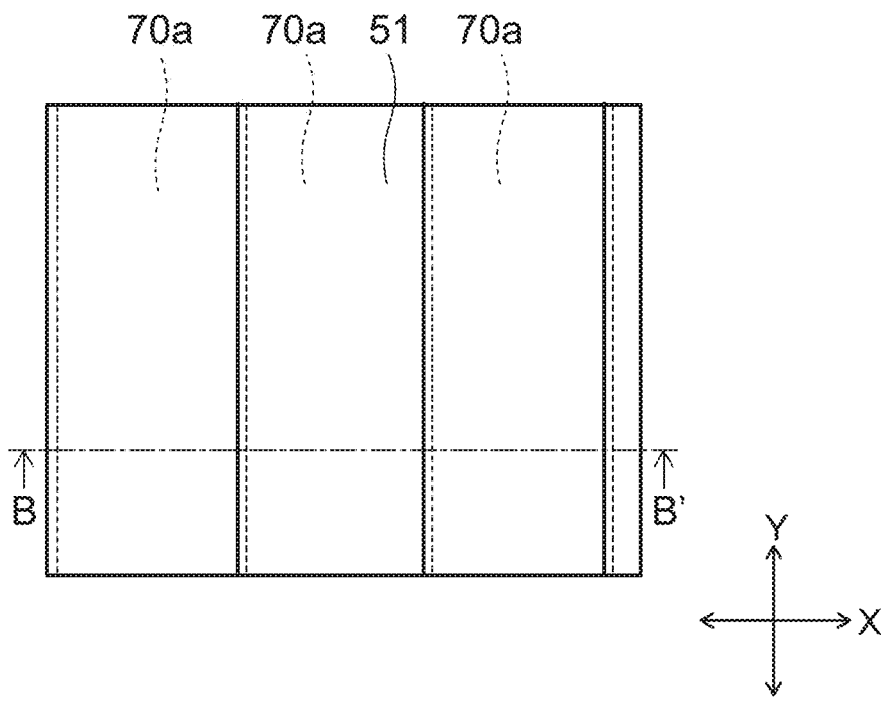
Figure 19B:
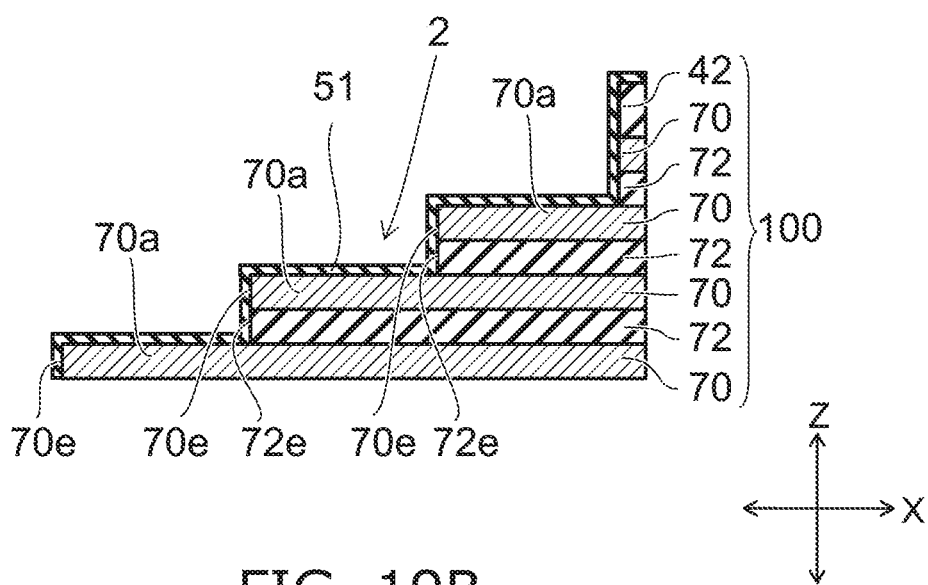

As shown in FIG. 19A and FIG. 19B, the first cover film 51 is formed on the stairstep portion 2. As the first cover film 51, for example, a silicon nitride film or an aluminum oxide film is formed by chemical vapor deposition (CVD) or atomic layer deposition (ALD). A metal oxide film other than the aluminum oxide film also can be used as the first cover film 51.

The first cover film 51 is formed conformally along the differences in levels of the stairstep portion 2; and differences in levels that reflect the differences in levels of the stairstep portion 2 are formed also in the surface of the first cover film 51. The first cover film 51 covers the upper surfaces of the terrace portions 70a. Also, the first cover film 51 covers the edges 70e in the X-direction of the terrace portions 70a and edges 72e in the X-direction of the sacrificial layers 72.

Figure 20A:
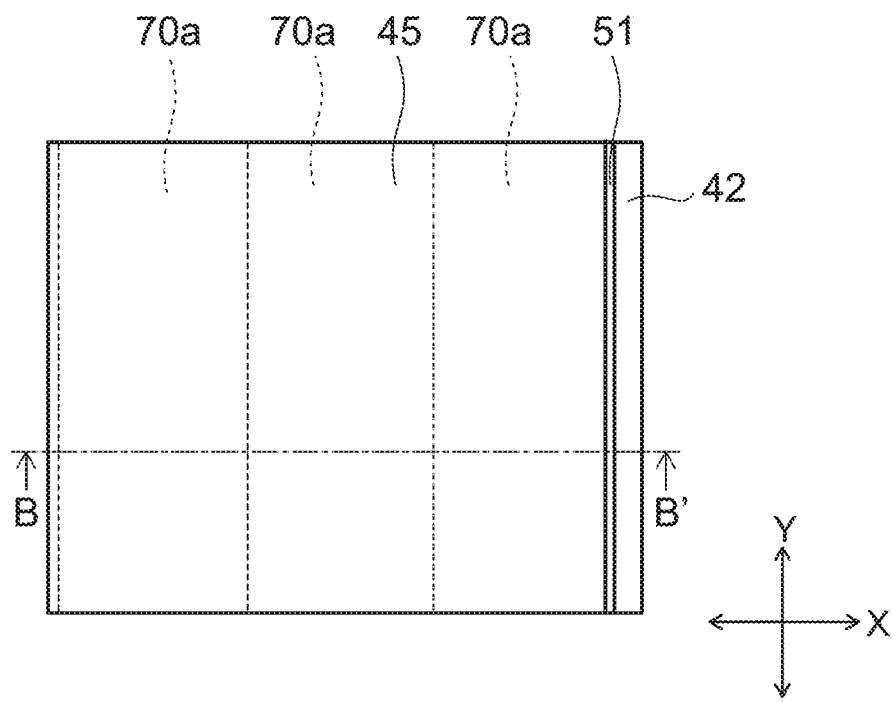
Figure 20B:
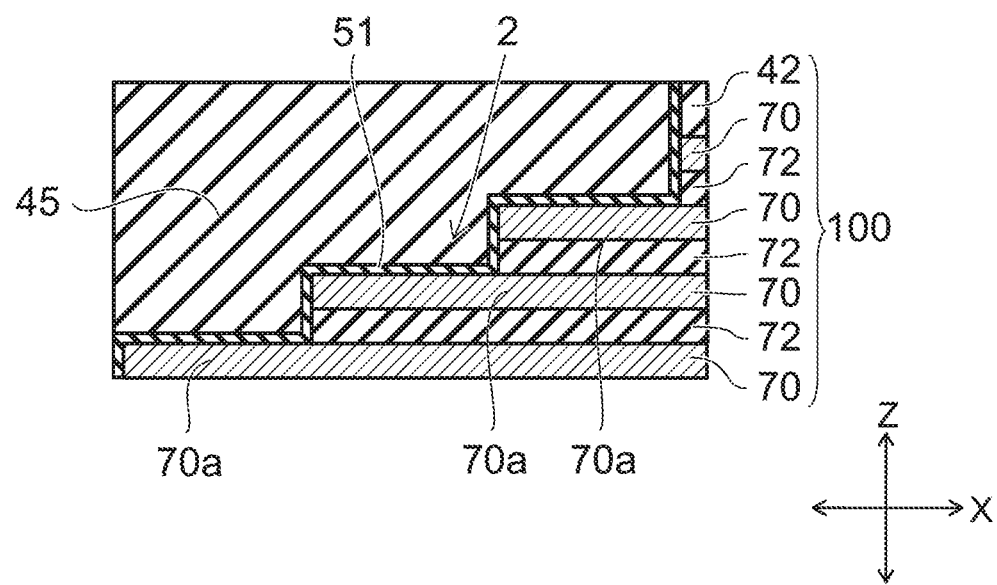

As shown in FIG. 20A and FIG. 20B, the insulating layer 45 is formed on the first cover film 51. The insulating layer 45 buries the differences in levels of the stairstep portion 2; and the upper surface of the insulating layer 45 is planarized.

The insulating layer 45 is a layer of a material different from the first cover film 51. For example, a silicon oxide layer is formed by CVD as the insulating layer 45.

Subsequently, the memory holes MH and the columnar portions CL are formed in the region of the stacked body 100 where the memory cell array 1 is formed. At this time, simultaneously, the columnar portions HR shown in FIG. 21A and FIG. 21B can be formed in the stacked body 100 of the stairstep portion 2, and in the first cover film 51 and the insulating layer 45 on the stacked body 100 of the stairstep portion 2. Or, the columnar portions HR may be formed by a process other than that of the columnar portions CL.

Subsequently, as shown in FIG. 21B and FIG. 22, the third cover film 43 is formed on the insulating layer 45 on the stairstep portion 2. The third cover film 43 covers the upper ends of the columnar portions HR as shown in FIG. 21B.

The third cover film 43 is a film of a material different from the insulating layer 45. As the third cover film 43, for example, a silicon nitride film or an aluminum oxide film is formed by CVD or ALD. A metal oxide film other than the aluminum oxide film also can be used as the third cover film 43.

As shown in FIG. 15, the third cover film 43 is formed also on the insulating film 42 in the region where the memory cell array 1 is formed and covers the upper ends of the columnar portions CL.

Figure 23A:
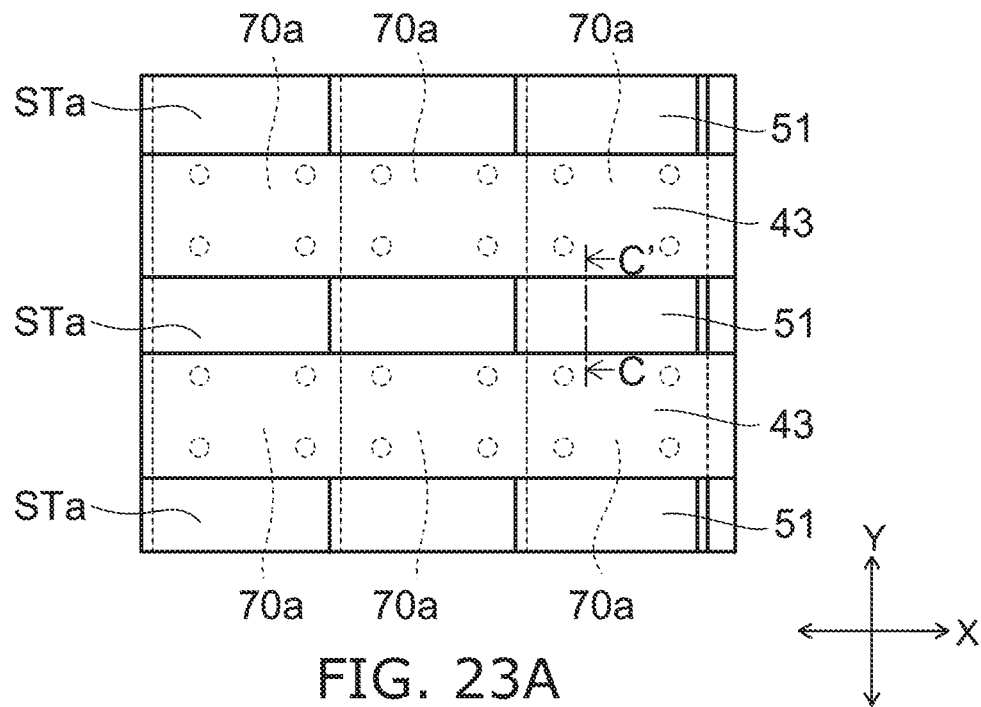
Figure 23B:
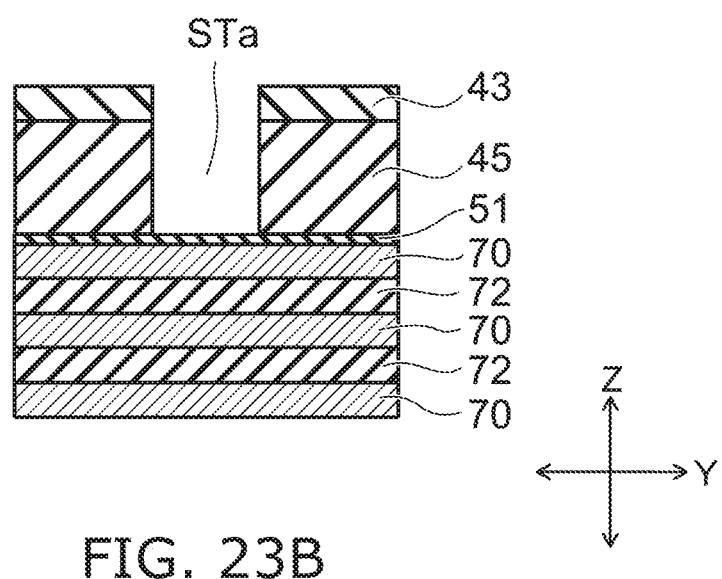

Slits (first slits) STa shown in FIG. 23A and FIG. 23B are made in the insulating layer 45 and the third cover film 43 on the stairstep portion 2. The slits STa extend in the X-direction as shown in FIG. 23A, pierce the third cover film 43 and the insulating layer 45, and reach the first cover film 51 as shown in FIG. 23B. The surface of the first cover film 51 having the stairstep configuration is exposed at the bottoms of the slits STa.

For example, the slits STa are made by RIE using the not-shown resist film as a mask. At this time, the first cover film 51 of the material different from the insulating layer 45 functions as an etching stopper.

Figure 24A:
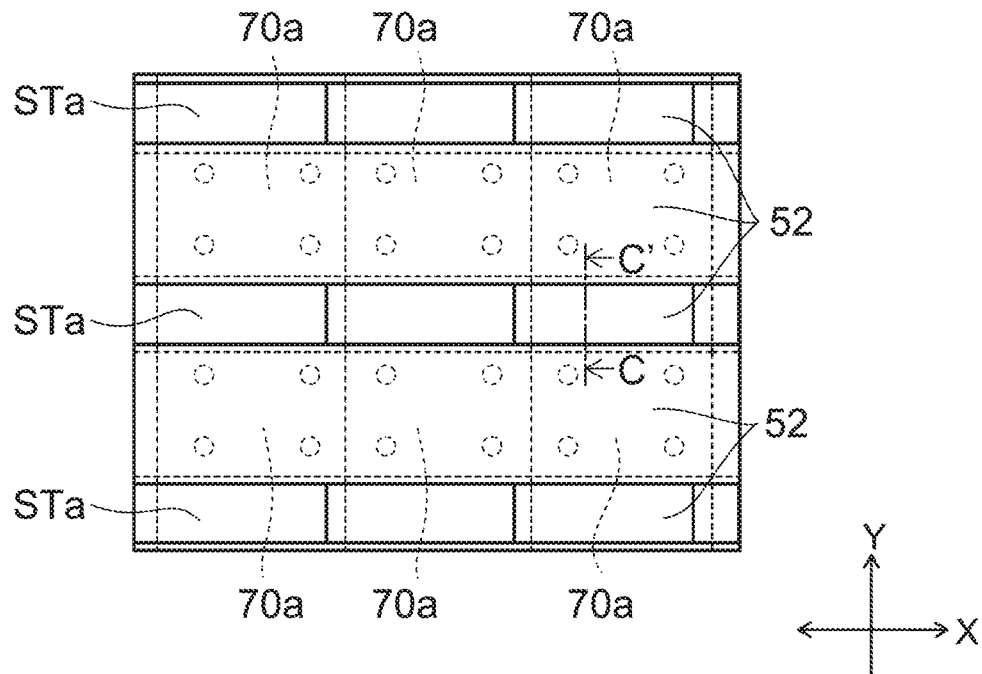
Figure 24B:
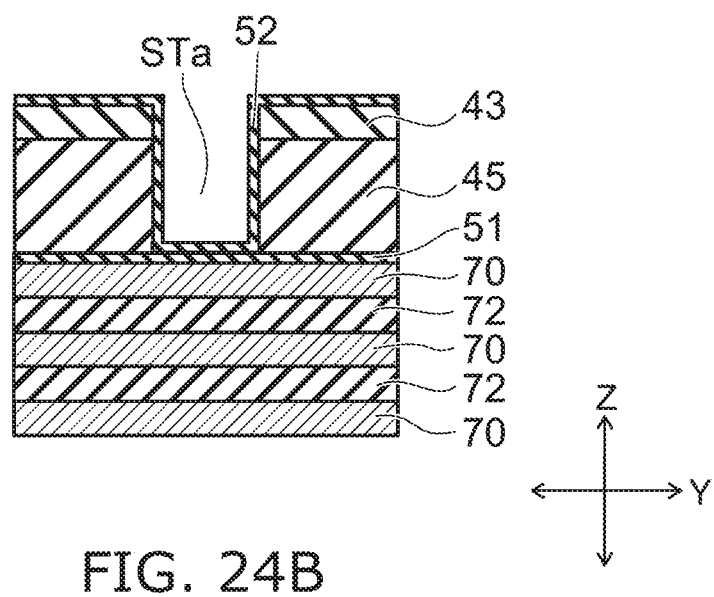

The second cover film 52 shown in FIG. 24A and FIG. 24B is formed inside the slits STa. The second cover film 52 is formed conformally along the upper surface of the third cover film 43, the side surface of the third cover film 43 exposed in the slits STa, the side surface of the insulating layer 45 exposed in the slits STa, and the first cover film 51 exposed at the bottoms of the slits STa.

The second cover film 52 is a film of a material different from the insulating layer 45. As the second cover film 52, for example, a silicon nitride film or an aluminum oxide film is formed by CVD or ALD. A metal oxide film other than the aluminum oxide film also can be used as the second cover film 52.

Then, the second cover film 52 and the first cover film 51 at the bottoms of the slits STa and further, the electrode layers 70 and the sacrificial layers 72 under the second cover film 52 and the first cover film 51 are etched by, for example, RIE. As shown in FIG. 25B, slits STb that communicate with the slits STa are made in the stacked body under the slits STa. The slits STa and STb collectively are shown as the slits ST.

When making the slits ST in the region of the stairstep portion 2, the slits ST (FIG. 15) are made simultaneously also in the region of the memory cell array 1. In the region of the stairstep portion 2 as well, the slits ST reach the substrate 10, extend in the X-direction as shown in FIG. 25A, and divide the stacked body of the stairstep portion 2 into a plurality of blocks (or finger portions) in the Y-direction.

Then, the sacrificial layers 72 are removed by an etchant or an etching gas supplied through the slits ST. For example, the sacrificial layers 72 which are silicon oxide layers are removed using an etchant containing hydrofluoric acid.

The sacrificial layers 72 are removed through the slits ST in the region of the memory cell array 1 and the region of the stairstep portion 2. In the region of the stairstep portion 2 as shown in FIG. 26A and FIG. 26B, the air gap 40 is made between the electrode layers 70 adjacent to each other above and below. The electrode layers 70 that are separated from each other in the stacking direction with the air gap 40 interposed are supported by the columnar portions HR.

The sacrificial layers 72 and the insulating layer 45 are layers (e.g., silicon oxide layers) of the same material. When etching the sacrificial layers 72, as shown in FIG. 26A, the upper surface of the insulating layer 45 and the side surface of the insulating layer 45 on the slit ST side are covered with the third cover film 43 and the second cover film 52 of the materials different from the insulating layer 45. Also, as shown in FIG. 26B, the first cover film 51 of the material different from the insulating layer 45 is formed between the insulating layer 45 and the air gap 40 made by removing the sacrificial layers 72 of the stairstep portion 2.

Accordingly, when etching the sacrificial layers 72 through the slits ST, the insulating layer 45 is protected by the first cover film 51, the second cover film 52, and the third cover film 43, and is not etched. Therefore, it is possible to appropriately form the contact vias described below in the insulating layer 45.

The upper ends of the columnar portions CL of the memory cell array 1 and the columnar portions HR of the stairstep portion 2 are covered with the third cover film 43; and the etching from the upper end side of the columnar portions CL and the etching from the upper end side of the columnar portions HR can be prevented when etching the sacrificial layers 72.

Also, the etching from the side surface side of the columnar portions CL and the etching from the side surface side of the columnar portions HR can be prevented by forming a film of a material different from the sacrificial layers 72 at the outermost circumferential portions of the columnar portions CL and the outermost circumferential portions of the columnar portions HR.

After making the air gap 40, contact holes 90 shown in FIG. 27 are made in the insulating layer 45. For example, the plurality of contact holes 90 corresponding to the plurality of terrace portions 70a are made simultaneously by RIE.

The contact holes 90 pierce the third cover film 43, the insulating layer 45, and the first cover film 51, extend in the Z-direction, and reach the terrace portions 70a of the electrode layers 70 of the stairstep portion 2.

Subsequently, a conductive material is buried in the contact holes 90; and the contact vias 91 shown in FIG. 6B are formed.

In the process of forming the columnar portions CL shown in FIG. 14, the films included in the columnar portions CL that are deposited on the insulating film 42 are deposited also on the insulating layer 45 on the stairstep portion 2. The deposition films on the insulating layer 45 can remain without being removed and can be used as the third cover film protecting the upper surface of the insulating layer 45 when etching the sacrificial layers 72. Or, the mask layer that is used when making the slits ST by RIE also can be used as the third cover film.

Figure 28A:
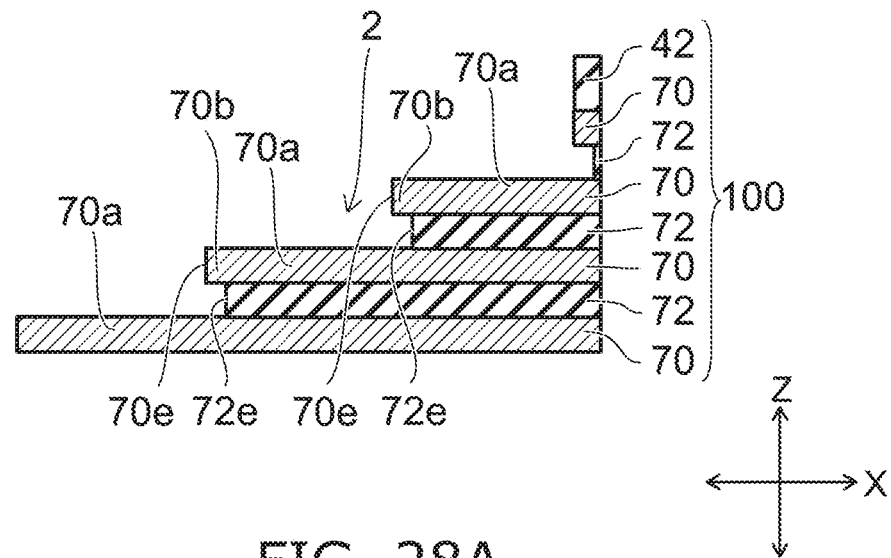

After forming the stairstep portion 2 shown in FIG. 18B, the edges 72e in the X-direction of the sacrificial layers 72 may be caused to recede from the edges 70e of the terrace portions 70a of the electrode layers 70 by isotropic etching as shown in FIG. 28A.

Figure 28B:
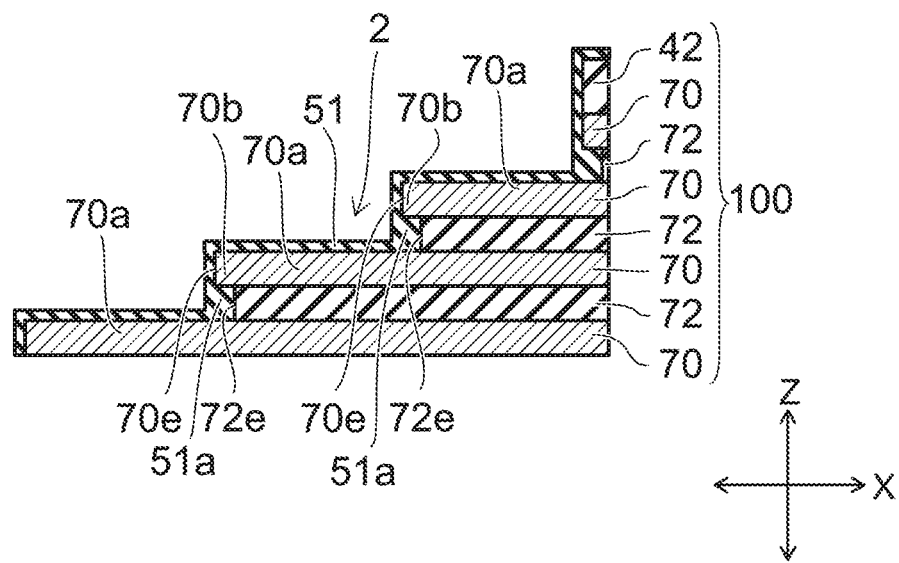

Then, by forming the first cover film 51 to cover the stairstep portion 2, one portion 51a of the first cover film 51 is formed also at the portion where the edge 72e of the sacrificial layer 72 recedes as shown in FIG. 28B. The one portion 51a of the first cover film 51 is provided between a tip portion 70b of the terrace portion 70a on the edge 70e side and the other electrode layer 70 under the tip portion 70b.

Figure 29A:
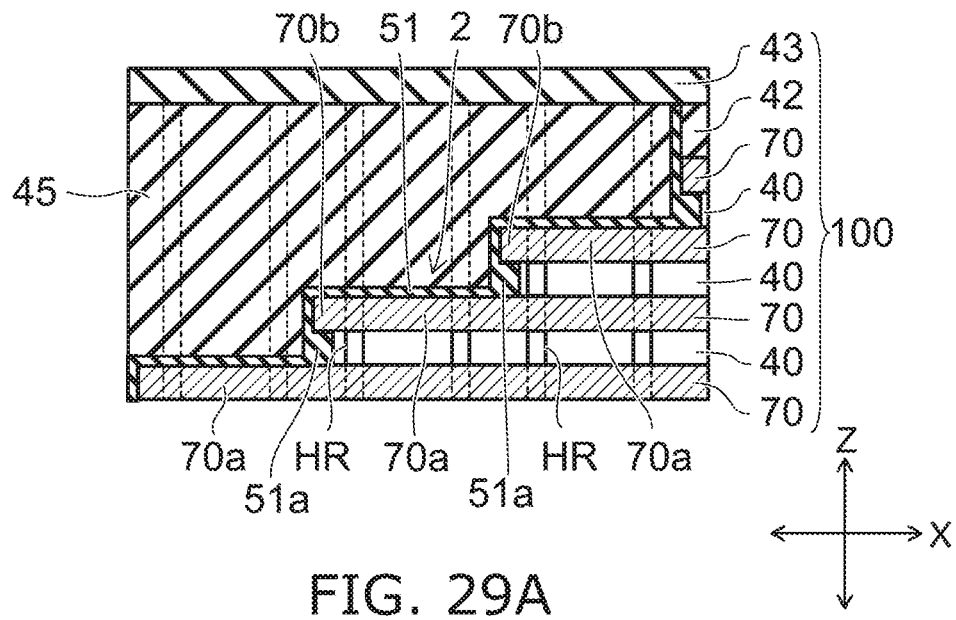

Subsequently, the processes described above proceed; the sacrificial layers 72 are removed; and the air gap 40 is made between the electrode layers 70 as shown in FIG. 29A. At this time, the tip portion 70b of the terrace portion 70a is supported, via the one portion 51a of the first cover film 51, on the other electrode layer 70 under the tip portion 70b. Such one portion 51a of the first cover film 51 increases the support strength of the tip portion 70b of the terrace portion 70a.

Figure 29B:
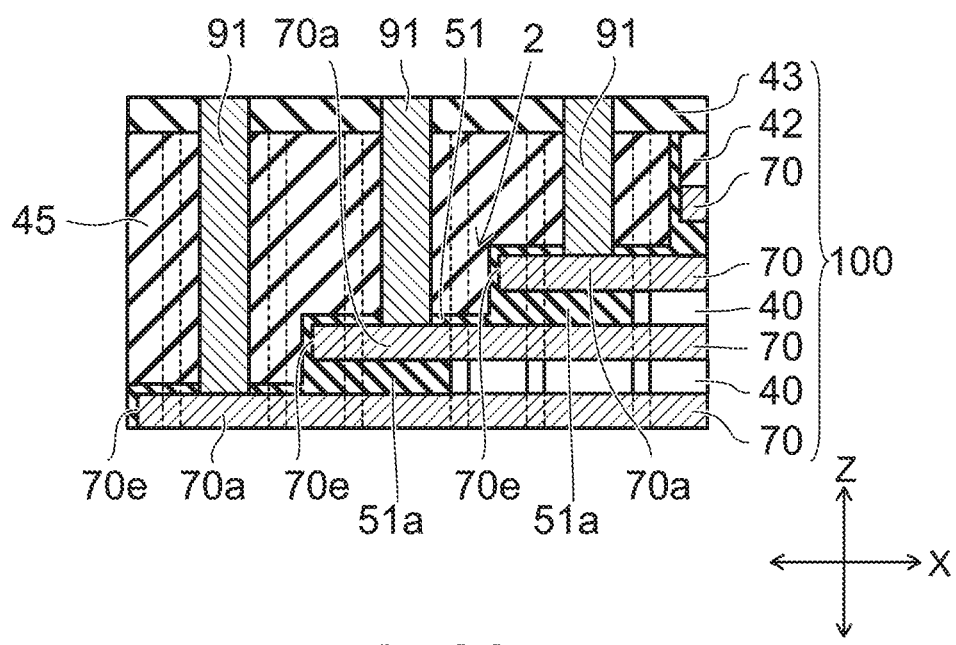

Also, as shown in FIG. 29B, the one portion 51a of the first cover film 51 may spread to the region overlapping the lower end of the contact via 91. When making the contact hole 90 shown in FIG. 27, even in the case where the contact hole 90 extends through the terrace portion 70a to be connected, the one portion 51a of the first cover film 51 can be interposed between the lower end of the contact hole 90 and the electrode layer 70 of the other layer under the lower end of the contact hole 90. This prevents the electrode layers 70 of different layers from undesirably shorting via the contact vias 91.

Figure 30:
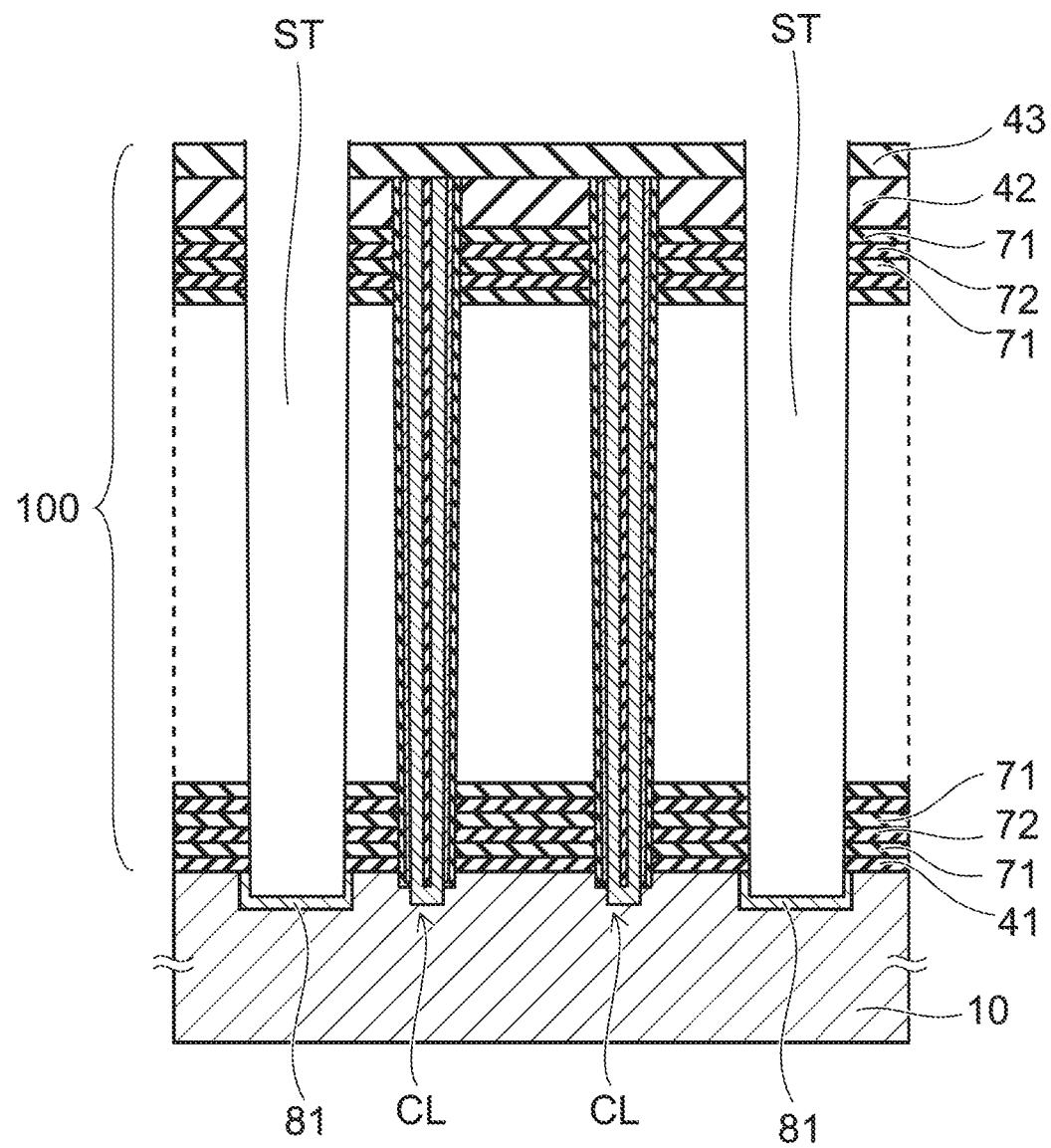

The electrode layers 70 also can be formed by replacing the sacrificial layers. In such a case, as shown in FIG. 30, a first sacrificial layer 71 as the first layer and the second layer (the second sacrificial layer or the insulating layer) 72 are stacked alternately on the substrate 10. For example, the first sacrificial layer 71 is a silicon nitride layer; and the second layer 72 is a silicon oxide layer.

This proceeds similarly to the embodiment recited above up to making the slits ST; and the first sacrificial layers 71 are removed by an etchant or an etching gas supplied through the slits ST. For example, the first sacrificial layers 71 which are silicon nitride layers are removed using an etchant containing phosphoric acid.

Figure 31:
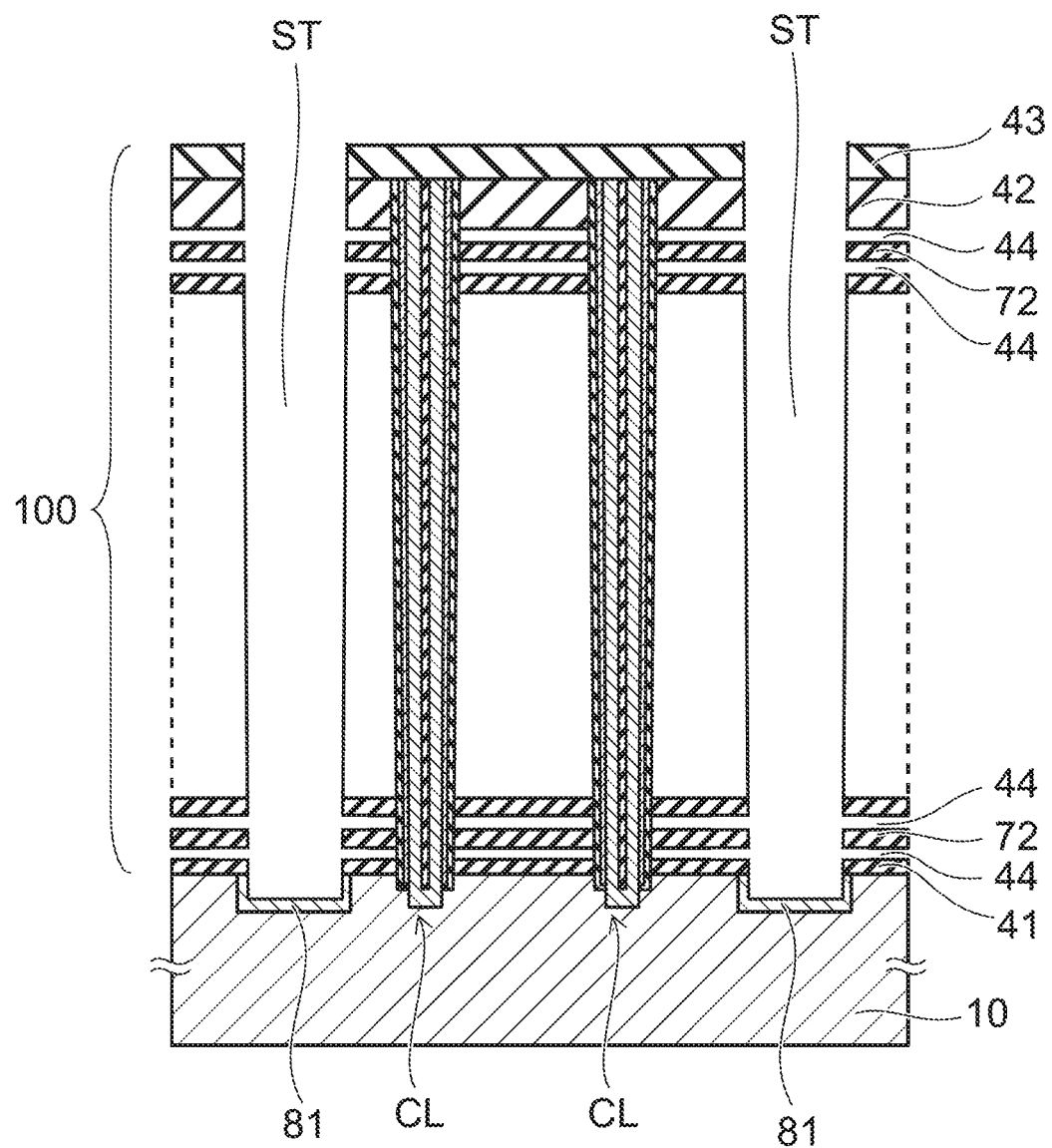

The first sacrificial layers 71 are removed; and as shown in FIG. 31, a gap 44 is made between the second layers 72, between the insulating film 41 and the lowermost second layer 72, and between the insulating film 42 and the uppermost second layer 72.

The electrode layers 70 are buried in the gap 44 by, for example, CVD; and the same structure as FIG. 15 described above is obtained. The gas of the CVD is supplied to the gap 44 via the slits ST.

Subsequently, the second layers 72 may be removed by etching through the slits ST; or the second layers 72 may remain as insulating layers.

At this time, the first sacrificial layers 71 are replaced with the electrode layers 70 in the stacked body of the stairstep portion 2 as well.

Figure 32A:
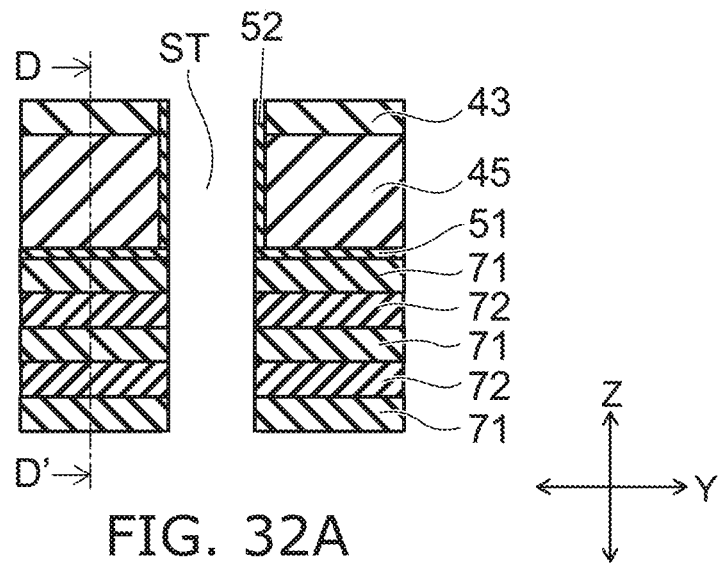
Figure 33A:
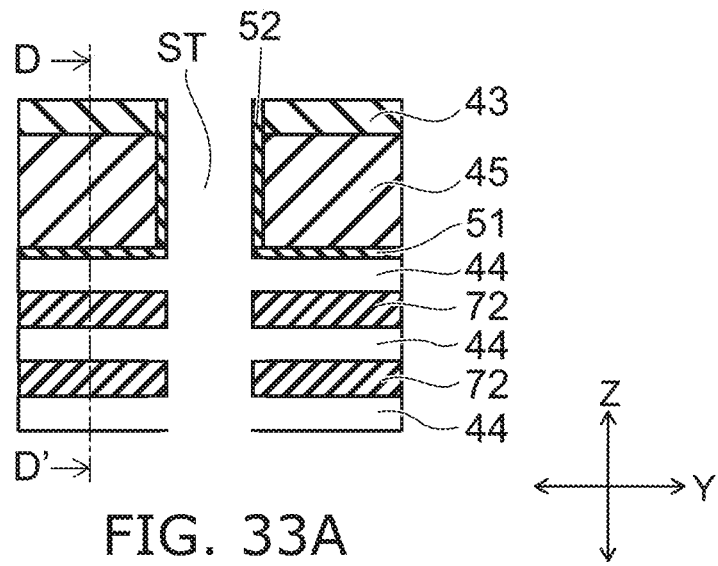

FIG. 32A and FIG. 33A are cross-sectional views corresponding to FIG. 25B and FIG. 26A described above.

Figure 32B:
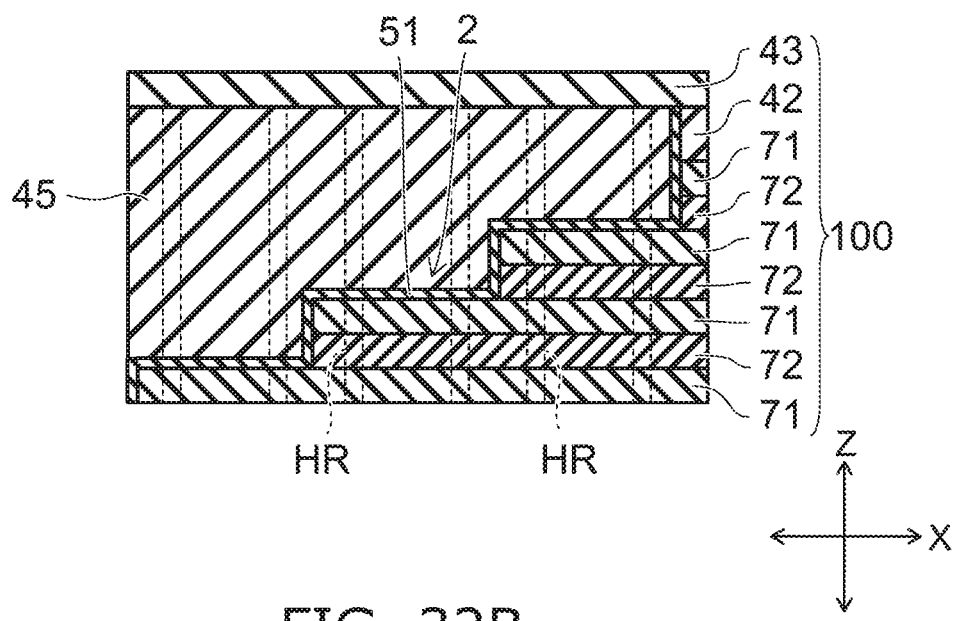

FIG. 32B is a D-D' cross-sectional view of FIG. 32A.

Figure 33B:
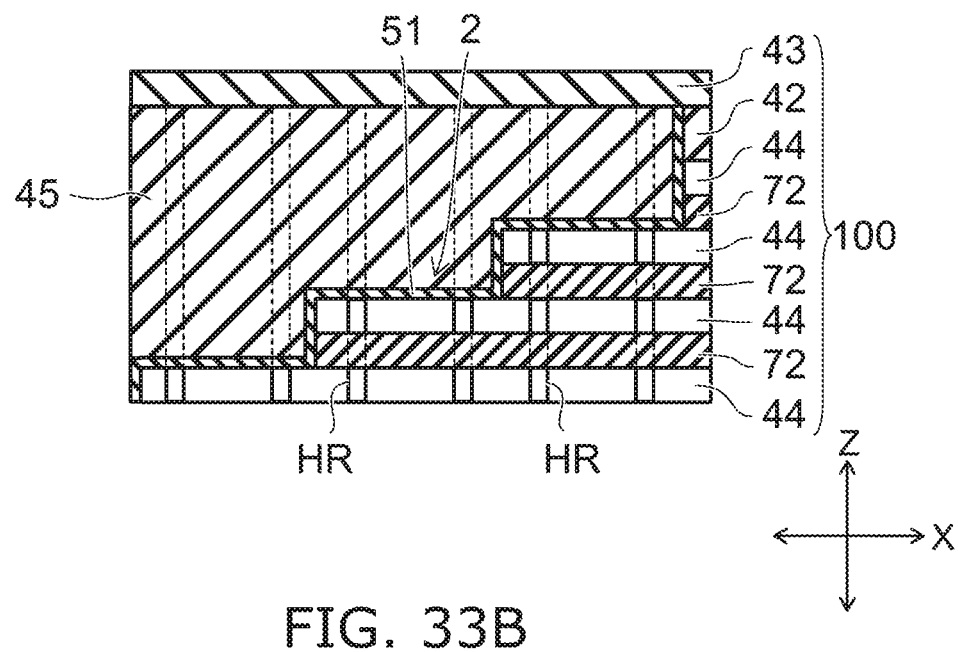

FIG. 33B is a D-D' cross-sectional view of FIG. 33A.

In the stairstep portion 2 as well, the first sacrificial layers 71 shown in FIG. 32A and FIG. 32B are removed by etching through the slits ST. The first sacrificial layers 71 are removed; and the gap 44 is made as shown in FIG. 33A and FIG. 33B.

The upper surface of the insulating layer 45 and the side surface of the insulating layer 45 on the slit ST side are covered with the third cover film 43 and the second cover film 52, which are of materials different from the insulating layer 45. Further, the first cover film 51 of the material different from the insulating layer 45 is formed between the insulating layer 45 and the gap 44 as well. For example, a metal oxide film such as an aluminum oxide film or the like is used as the first cover film 51, the second cover film 52, and the third cover film 43.

Accordingly, even in the case where the insulating layer 45 is a layer of the same material as the first sacrificial layers 71, the insulating layer 45 is protected by the first cover film 51, the second cover film 52, and the third cover film 43, and is not etched when etching the first sacrificial layers 71.

The electrode layers 70 are buried in the gap 44. Subsequently, when the second layers 72 are removed by etching through the slits ST, the insulating layer 45 is not etched even in the case where the insulating layer 45 is of the same material as the second layer 72 because the insulating layer 45 is protected by the first cover film 51, the second cover film 52, and the third cover film 43.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate;
   a stacked body provided above the substrate, the stacked body including a plurality of electrode layers stacked with an air gap interposed, the stacked body including a stairstep portion in which the electrode layers are arranged in a stairstep configuration with a difference in levels in a first direction;
   a first columnar portion including a semiconductor body and a stacked film, the semiconductor body extending in a stacking direction through the stacked body, the stacked film including a charge storage portion and being provided between the semiconductor body and the electrode layers;
   an insulating layer provided above the stairstep portion;
   a first cover film provided between the stairstep portion and the insulating layer, the first cover film being of a material different from the insulating layer, the first cover film covering edges in the first direction of the electrode layers of the stairstep portion, and plugging the air gap between the electrode layers of the stairstep portion;
   a separation portion extending in the stacking direction and the first direction, and dividing the stacked body and the insulating layer in a second direction intersecting the first direction; and
   a second cover film provided at a side surface of the insulating layer on the separation portion side, the second cover film being of a material different from the insulating layer.

2. The semiconductor device according to claim 1, wherein
   one portion of the first cover film plugging the air gap is provided between a tip portion of one electrode layer of the stairstep portion on the edge side and another electrode layer under the tip portion, and
   the tip portion of the one electrode layer is supported, via the one portion of the first cover film, on another electrode layer under the tip portion.

3. The semiconductor device according to claim 2, further comprising a contact via contacting the one electrode layer of the stairstep portion and extending in the stacking direction through the insulating layer,
   the one portion of the first cover film spreading to a region overlapping a lower end of the contact via.

4. The semiconductor device according to claim 1, further comprising a contact via contacting one electrode layer of the stairstep portion and extending in the stacking direction through the insulating layer.

5. The semiconductor device according to claim 1, wherein
   the insulating layer is a silicon oxide layer, and
   the first cover film and the second cover film are a silicon nitride film or a metal oxide film.

6. The semiconductor device according to claim 1, wherein
   the separation portion includes:
   an interconnect portion; and
   an insulating film provided between the interconnect portion and the second cover film, and between the interconnect portion and the stacked body.

7. The semiconductor device according to claim 1, further comprising a third cover film provided on the insulating layer, the third cover film being of a material different from the insulating layer.

8. The semiconductor device according to claim 7, further comprising a second columnar portion extending in the stacking direction through the stacked body of the stairstep portion, through the insulating layer above the stairstep portion, and through the first cover film between the stairstep portion and the insulating layer.

9. The semiconductor device according to claim 8, wherein the third cover film covers an upper end of the second columnar portion.

* * * * *